(12) United States Patent
Ito

(10) Patent No.: US 11,283,043 B2
(45) Date of Patent: Mar. 22, 2022

(54) LAMINATED FILM AND PROCESS FOR MANUFACTURING THE SAME

(71) Applicant: SUMITOMO CHEMICAL COMPANY, LIMITED, Tokyo (JP)

(72) Inventor: Yutaka Ito, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/472,027

(22) Filed: Mar. 28, 2017

(65) Prior Publication Data

US 2017/0288171 A1 Oct. 5, 2017

(30) Foreign Application Priority Data

Mar. 31, 2016 (JP) .............................. JP2016-070404

(51) Int. Cl.
*C23C 16/40* (2006.01)
*B32B 27/28* (2006.01)
(Continued)

(52) U.S. Cl.
CPC ........ *H01L 51/5253* (2013.01); *C23C 16/401* (2013.01); *C23C 16/509* (2013.01);
(Continued)

(58) Field of Classification Search
None
See application file for complete search history.

(56) References Cited

U.S. PATENT DOCUMENTS 8,906,492 B2  12/2014  Suzuki et al.
2010/0166977 A1  7/2010  Brand et al.
(Continued)

FOREIGN PATENT DOCUMENTS

JP    2003118030 A  *  4/2003
JP    2009220530 A  *  10/2009
(Continued)

OTHER PUBLICATIONS

English machine translation of JP2009-220530 (2009).*
English machine translation of JP2003-118030 (2003).*

*Primary Examiner* — Kenneth J Stachel
(74) *Attorney, Agent, or Firm* — Birch, Stewart, Kolasch & Birch, LLP

(57) ABSTRACT

A laminated film is provided which can prevent transmission of water vapor at a high level, and can suppress prevention of dark spots over a long period of time when used as a supporting substrate of an electronic device such as an organic EL element, and a laminated film is provided comprising at least a gas barrier layer and an inorganic polymer layer laminated on a resin substrate, wherein the arithmetic average height (Sa) of a surface of the inorganic polymer layer is 20 nm or less, and the $NH_3$ gas generation amount per unit mass of the inorganic polymer layer when the laminated film comprising the inorganic polymer layer is accommodated in a sample chamber, and the interior of the sample chamber is heated at 85° C. for 1 hour while the humidified air at 25° C. and 85% RH is flown through the sample chamber is 5000 mass ppm or less.

4 Claims, 5 Drawing Sheets
(1 of 5 Drawing Sheet(s) Filed in Color)

(51) Int. Cl.
*H01L 51/52* (2006.01)
*H01L 51/00* (2006.01)
*C23C 16/509* (2006.01)
*C23C 16/54* (2006.01)

(52) U.S. Cl.
CPC ........ *C23C 16/545* (2013.01); *H01L 51/0097* (2013.01); *Y02E 10/549* (2013.01); *Y02P 70/50* (2015.11)

(56) References Cited

U.S. PATENT DOCUMENTS

| | | | | |
|---|---|---|---|---|
| 2012/0040107 A1* | 2/2012 | Hasegawa | ............. | C23C 16/401 |
| | | | | 428/1.1 |
| 2012/0107607 A1 | 5/2012 | Takaki et al. | | |
| 2015/0111046 A1* | 4/2015 | Murota | ...................... | C08J 7/04 |
| | | | | 428/446 |
| 2015/0247241 A1* | 9/2015 | Ezure | ...................... | C23C 16/40 |
| | | | | 428/446 |
| 2015/0303398 A1* | 10/2015 | Ii | ........................... | H01L 51/442 |
| | | | | 257/40 |
| 2016/0312363 A1* | 10/2016 | Yamashita | ............ | C23C 16/507 |

FOREIGN PATENT DOCUMENTS

| | | |
|---|---|---|
| JP | 2011-73430 A | 4/2011 |
| JP | 4921612 B2 | 4/2012 |
| JP | 5183469 B2 | 4/2013 |
| JP | 5402818 B2 | 1/2014 |
| JP | 5585267 B2 | 9/2014 |
| JP | 5646478 B2 | 12/2014 |
| WO | WO 2014/141821 A1 | 9/2014 |
| WO | WO-2015098671 A * 7/2015 ........... C23C 16/507 | |

\* cited by examiner

FIG. 7

| | Example 1 | Example 2 | Example 3 | Example 4 | Comparative Example 1 | Comparative Example 4 | Example 5 |
|---|---|---|---|---|---|---|---|
| 0h | | | | | | | |
| 100h | | | | | | | |
| DS area ratio (%) | 0.0 | 1.0 | 0.8 | 0.0 | 19.8 | 19.2 | 0.3 |

LAMINATED FILM AND PROCESS FOR MANUFACTURING THE SAME

BACKGROUND OF THE INVENTION

Field of the Invention

The present invention relates to a laminated film and a process for producing the same.

Description of the Related Art

In recent years, as a self light-emitting element, an organic electroluminescent element (hereinafter, also referred to as "organic EL element") has been paid attention. The organic EL element is an element having a structure in which a light emitting layer of an organic compound is sandwiched by electrodes on a support substrate, which emits light by supplying an electric current between electrodes. The organic EL element is deteriorated when an oxygen gas and the water vapor enter the element, and a light emitting defective portion called dark spot is generated. For this reason, in the field of the organic EL element, in order to suppress an oxygen gas and the water vapor from entering the element, utilization of a substrate having high performance of preventing transmission of the gas such as the water vapor in the support substrate of a light emitting element portion thereof has been proposed.

As a substrate having gas transmission preventing performance utilized in the organic EL element, for example, a gas barriering laminated film provided with a substrate, and a thin film layer containing silicon, oxygen and carbon, which is formed on a surface thereof, has been proposed (e.g. see Patent Document 1).

PRIOR ART DOCUMENT

Patent Document

Patent Document 1: JP-A-2011-73430

SUMMARY OF THE INVENTION

The laminated film described in Patent Document 1 can afford high gas transmission preventing performance to the water vapor. However, in recent years, the laminated film is required to have water vapor transmission preventing performance at the higher level, and particularly, development of a laminated film which can suppress generation of dark spots over a long period of time, when used as a supporting substrate of an electronic device such as an organic EL element, has been demanded.

The present invention was made in view of the problems possessed by the conventional technique, and an object thereof is to provide a laminated film which can prevent transmission of the water vapor at the high level, and can suppress generation of dark spots over a long period of time when used as a supporting substrate of an electronic device such as an organic EL element, and a process for manufacturing it.

In order to attain the object, the present invention provides a laminated film comprising at least a gas barrier layer and an inorganic polymer layer being laminated on a resin substrate, wherein the arithmetic average height (Sa) of a surface of the inorganic polymer layer is 20 nm or less, the $NH_3$ gas generation amount per unit mass of the inorganic polymer layer when the laminated film comprising the inorganic polymer layer is accommodated in a sample chamber, and the interior of the sample chamber is heated at 85° C. for 1 hour while the humidified air at 25° C. and 85% RH is flown through the sample chamber is 5000 mass ppm or less.

According to the laminated film, by provision with the inorganic polymer layer having the arithmetic average height (Sa) and the $NH_3$ gas generation amount in the above-mentioned range, while gas barrier property of the inorganic polymer layer itself is added, a defect such as a crack or a via hole present in the gas barrier layer can be made up for, it becomes possible to prevent transmission of the water vapor at the higher level, and at the same time, since the inorganic polymer layer protects the gas barrier layer, when used as a supporting substrate of an electronic device such as an organic EL element, process resistance at electronic device manufacturing and stability of the resulting electronic device at long term storage can be dramatically enhanced, and it becomes possible to suppress generation of dark spots over a long period of time. And, these effects can be sufficiently obtained by that the arithmetic average height (Sa) of the inorganic polymer layer and the $NH_3$ gas generation amount are in the above-mentioned range. Herein, when the $NH_3$ gas generation amount is large, it adversely influences water vapor transmission preventing property of the laminated film, and at the same time, a defect and the like are easily generated by influence of $NH_3$ gas generation when an electronic device is manufactured using the laminated film, and at storage after manufacturing. Additionally, the $NH_3$ gas generation amount becomes an index of an amount of a nitrogen atom which is easily released from the inorganic polymer layer under the high temperature high humidity environment, although a $NH_3$ gas is present in the inorganic polymer layer. That is, a difference in the $NH_3$ gas generation amount represents a difference in a structure and a composition of the interior of the inorganic polymer layer. The present inventors found out that as this $NH_3$ gas generation amount is smaller, the inorganic polymer layer is in the structurally and compositionally stable state, and the above-mentioned effects are more sufficiently obtained. Additionally, the present inventors found out that the $NH_3$ gas generation amount is also changed by a method of forming a film of the inorganic polymer layer and the film formation condition, and by this $NH_3$ gas generation amount being in the above-mentioned range, the inorganic polymer layer is in the optimal film state for exerting the above-mentioned effects. Furthermore, the present inventors found out that by the arithmetic average height (Sa) being in the above-mentioned range, the inorganic polymer layer has high surface flatness, a defect of the gas barrier layer can be effectively made up for, and at the same time, the function of protecting the gas barrier layer is excellent, and the inorganic polymer layer is in the optimal film state for exerting the above-mentioned effects. That is, by provision with the inorganic polymer layer simultaneously satisfying the ranges of these arithmetic average height (Sa) and $NH_3$ gas generation amount, the laminated film can prevent transmission of the water vapor at the high level, and can suppress generation of dark spots over a long period when used as a supporting substrate of an electronic device such as an organic EL element.

In the laminated film, it is preferable that the $NH_3$ gas generation amount in the inorganic polymer layer is 3000 mass ppm or less. Thereby, the laminated film can prevent transmission of the water vapor at the high level, and can more sufficiently suppress generation of dark spots over a long period when used as a supporting substrate of an electronic device such as an organic EL element.

In the laminated film, it is preferable that the $NH_3$ gas generation amount in the inorganic polymer layer is 50 mass ppm or more. That is, it is preferable that, in the inorganic polymer layer, a nitrogen atom exits to an extent that it can satisfy the range of the $NH_3$ gas generation amount, thereby, the laminated film can prevent transmission of the water vapor at the higher level, and can more sufficiently suppress generation of dark spots over a long period when applied to an electronic device.

In the laminated film, the gas barrier layer may be a layer which was formed by chemical vapor deposition (CVD method).

In the laminated film, it is preferable that the gas barrier layer is a silicon oxide-based layer which contains a silicon atom, an oxygen atom and a carbon atom, and satisfies all of the following conditions (i) to (iii), in a silicon distribution curve, an oxygen distribution curve and a carbon distribution curve, each showing a relationship between a distance from a surface of the gas barrier layer in a film thickness direction of the gas barrier layer, and the ratio of an amount of a silicon atom (atomic ratio of silicon), the ratio of an amount of an oxygen atom (atomic ratio of oxygen) or the ratio of an amount of a carbon atom (atomic ratio of carbon), to a total amount of a silicon atom, an oxygen atom and a carbon atom.

(i) The atomic ratio of silicon, the atomic ratio of oxygen and the atomic ratio of carbon satisfy the expression (1):

(Atomic ratio of oxygen)>(atomic ratio of silicon)> (atomic ratio of carbon)  (1)

in a region which is 90% or more of a film thickness of the gas barrier layer.
(ii) The carbon distribution curve has at least one extreme value.
(iii) An absolute value of a difference between a maximum value and a minimum value of the atomic ratio of carbon in the carbon distribution curve is 5 at % or more.

By the gas barrier layer having the above feature, the laminated film can afford more excellent barrier property to an oxygen gas and the water vapor, and at the same time, can afford excellent flex resistance.

In the laminated film, it is preferable that the gas barrier layer contains a silicon atom, an oxygen atom and a nitrogen atom, and the gas barrier layer is a silicon oxide-based layer satisfying all of the conditions (iv) and (v).
(iv) The gas barrier layer has a second thin film layer, a first thin film layer and a third thin film layer which have different oxygen content ratios, from a resin substrate side, and an average composition of a silicon atom, an oxygen atom and a nitrogen atom of the first thin film layer is in the range of 10 at %≤Si≤40 at %, 5 at %≤O≤30 at %, 50 at %≤N≤80 at %.
(v) The elemental ratio of a nitrogen atom and a silicon atom of the second and third thin film layers is in the range of the expression (2).

N/Si≤0.2  (2).

By the gas barrier layer having the above feature, the laminated film can afford more excellent barrier property to an oxygen gas and the water vapor, and at the same time, can afford excellent flex resistance.

In the laminated film, the inorganic polymer layer is preferably a layer composed of a curing product which is obtained by curing a composition containing an inorganic polymer by irradiation of vacuum ultraviolet light at the wavelength of 200 nm or less. Thereby, the inorganic polymer layer becomes in the suitable cured state for exerting the effects of the present invention, and the laminated film can prevent transmission of the water vapor at the higher level, and can more sufficiently suppress generation of dark spots over a long period when applied to an electronic device.

In the laminated film, the inorganic polymer layer is preferably a layer composed of a curing product of a composition containing polysilazane. Since polysilazane easily progresses a reaction by addition of a catalyst, and is easily modified to vitrify, and at the same time, the reaction is not a condensation reaction, but a substitution reaction, there is an advantage that the shrinkage rate is small. Additionally, since the molecular size of elimination components ($H_2$ and $NH_3$) which are generated in the reaction is small, a uniform film having high surface flatness is easily formed. For this reason, by the inorganic polymer layer being a layer composed of a curing product of a composition containing polysilazane, the laminated film can prevent transmission of the water vapor at the higher level, and can more sufficiently suppress generation of dark spots over a long period when applied to an electric device.

In the laminated film, it is preferable that at least the resin substrate, the gas barrier layer, and the inorganic polymer are laminated in this order.

The present invention also provides a process for manufacturing a laminated film comprising at least a gas barrier layer and an inorganic polymer layer being laminated on a resin substrate, comprising a step of forming the gas barrier layer by chemical vapor deposition, wherein the arithmetic average height (Sa) of a surface of the inorganic polymer layer is 20 nm or less, and the $NH_3$ gas generation amount per unit mass of the inorganic polymer layer when the laminated film containing the inorganic polymer layer is accommodated in a sample chamber, and the interior of the sample chamber is heated at 85° C. for 1 hour while the humidified air is flown through the sample chamber is 5000 mass ppm or less.

It is preferable that the manufacturing process has a step of forming the inorganic polymer layer by curing a composition containing an inorganic polymer by irradiation of vacuum ultraviolet light having the wavelength of 200 nm or less.

Effect of the Invention

According to the present invention, there can be provided a laminated film which can prevent transmission of the water vapor at the high level, and can suppress generation of dark spots over a long period of time when used as a supporting substrate of an electron device such as an organic EL element, and a process for manufacturing it.

BRIEF DESCRIPTION OF THE DRAWINGS

The patent or application file contains at least one color drawing. Copies of this patent or patent application publication with color drawing will be provided by the USPTO upon request and payment of the necessary fee.

FIG. 7 is a view summarizing an observed image showing the light emitting state at an initial stage and after storage at 60° C. and 90% RH for 100 hours of organic EL elements obtained in Examples and Comparative Examples, and a dark spot area ratio;

DETAILED DESCRIPTION OF THE PREFERRED EMBODIMENTS

Preferable embodiments of the present invention will be illustrated in detail below, while referring to the figures. In addition, in the following illustration and drawings, the same symbol is added to the same or equivalent part, and overlapped illustration will be omitted. Additionally, the dimensional ratio of the drawings is not limited to the illustrated ratio.

[Laminated Film]

Figure 1:
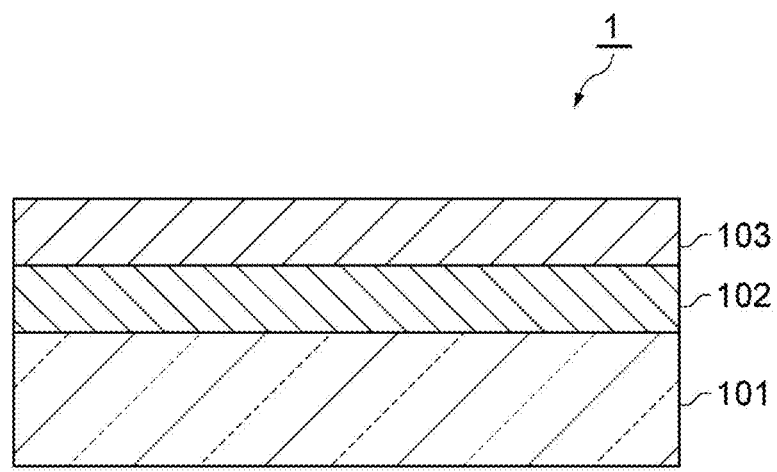
FIG. 1 is a schematic cross-sectional view showing one embodiment of the laminated film of the present invention.

FIG. 1 is a schematic cross-sectional view showing one embodiment of the laminated film of the present invention. As shown in FIG. 1, the laminated film (gas barriering laminated film) 1 of the present embodiment has a structure in which a gas barrier layer 102 and an inorganic polymer layer 103 are laminated on a resin substrate 101. In the laminated film 1, the arithmetic average height (Sa) of a surface (surface on a side opposite to the gas barrier layer 102) of the inorganic polymer layer 103 is 20 nm or less. Additionally, the inorganic polymer layer 103 is a layer in which the $NH_3$ gas generation amount per unit mass of the inorganic polymer layer when the laminated film containing the inorganic polymer layer is accommodated in a sample chamber, and the interior of the sample chamber is heated at 85° C. for 1 hour while the humidified air at 25° C. and 85% RH is flown through the sample chamber is 5000 mass ppm or less. Each layer will be illustrated in detail below.

(Resin Substrate 101)

The resin substrate 101 is not particularly limited, as far as it is formed of a resin (organic polymer material) which can hold the gas barrier layer 102 and the inorganic polymer layer 103. As the resin substrate 101, a resin film can be used, and it is preferable to use colorless transparent one. Examples of the resin constituting the resin substrate 101 include polyester resins such as polyethylene terephthalate (PET) and polyethylene naphthalate (PEN); polyolefin resins such as polyethylene (PE), polypropylene (PP), and cyclic polyolefin; polyamide resins; polycarbonate resins; polystyrene resins; polyvinyl alcohol resins; saponification products of an ethylene-vinyl acetate copolymer; polyacrylonitrile resins; acetal resins; polyimide resins; polyether sulfide (PES), and if necessary, two or more of them can also be used by combination. Among them, it is preferable that a resin selected from a polyester resin and a polyolefin resin is used, in conformity with necessary properties such as transparency, heat resistance, and linear expansion property, and it is more preferable that PET, PEN, and a cyclic polyolefin are used. Alternatively, as the resin substrate 101, a laminate obtained by laminating two or more layers of the resins can also be used.

The resin substrate 101 may be an unstretched resin substrate, or may be a stretched resin substrate obtained by stretching an unstretched resin substrate in a flow direction of a resin substrate (MD direction), and/or a direction orthogonal with a flow direction of a resin substrate (TD direction), by the known method such as monoaxial stretching, tenter sequential biaxial stretching, tenter simultaneous biaxial stretching, and tubular simultaneous biaxial stretching.

A thickness of the resin substrate 101 is appropriately set in view of stability and the like when the laminated film 1 is manufactured, and since conveyance of the resin substrate 101 is also easy in vacuum, a thickness is preferably 5 to 500 μm. Furthermore, when the gas barrier layer 102 is formed by an interroll discharge plasma CVD method described later, since discharge is performed through the resin substrate 101, a thickness of the resin substrate 101 is more preferably 10 to 200 μm, and further preferably 20 to 100 μm.

In addition, from a view point of adherability between the gas barrier layer 102, the resin substrate 101 may be subjected to surface activation treatment for cleaning a surface thereof. Examples of such surface activation treatment include corona treatment, plasma treatment, and flame treatment.

(Gas Barrier Layer 102)

The gas barrier layer 102 is a layer having such gas barrier property that transmission of the gas such as the water vapor is prevented. "Gas barrier property" mentioned herein may be such that at least one condition of the following conditions (A) to (C) is satisfied.

<Condition (A)>

When "the gas transmission rate of a resin substrate (unit: $mol/m^2·s·P$)" and "the gas transmission rate of a resin substrate on which a film of a gas barrier layer is formed (unit: $mol/m^2·s·P$)" measured by the method in accordance with JIS K 7126 (published in 2006) are compared, the "gas transmission rate of a resin substrate on which a film of a gas barrier layer is formed" shows a value which is smaller by 2 or more orders of magnitude (1/100 or less value) relative to the "gas transmission rate of a resin substrate".

<Condition (B)>

When "the water vapor transmission rate of a resin substrate (unit: $g/m^2·s·P$)" and "the water vapor transmission rate of a resin substrate on which a film of a gas barrier layer is formed (unit: $g/m^2·s·P$)" measured by a method in accordance with the method described in JIS K 7129 (published in 2008) are compared, the "water vapor transmission rate of a resin substrate on which a film of a gas barrier layer is formed" shows a value which is smaller by 2 or more orders of magnitude (1/100 or less value) relative to the "water vapor transmission rate of a resin substrate".

<Condition (C)>

When "the water vapor transmission rate of a resin substrate (unit: $g/m^2·s·P$)" and "the water vapor transmission rate of a resin substrate on which a film of a gas barrier layer is formed (unit: $g/m^2·s·P$)" measured by a method in accordance with the method described in JP-A-2005-283561 are compared, the "water vapor transmission rate of a resin substrate on which a film of a gas barrier layer is formed" shows a value which is smaller by 2 or more orders of magnitude (1/100 or less value) relative to the "water vapor transmission rate of a resin substrate".

In addition, since generally, the water vapor transmission rate of a substrate on which a film of a gas barrier layer having water vapor barrier property (gas barrier property) is formed, shows a value of $10^{-2}$ g/m$^2$/day or less, when the conditions (B) and (C) are studied, the "water vapor transmission rate of a resin substrate on which a film of a gas barrier layer is formed" is preferably a value of $10^{-2}$ g/m$^2$/day or less, more preferably a value of $10^{-4}$ g/m$^2$/day or less, further preferably a value of $10^{-5}$ g/m$^2$/day or less, and particularly preferably a value of $10^{-6}$ g/m$^2$/day or less. As the gas barrier layer having such gas barrier property, one satisfying the condition (C) is more preferable.

A thickness of the gas barrier layer 102 is preferably in the range of 5 to 3000 nm, more preferably in the range of 10 to 2000 nm, further preferably in the range of 10 to 1000 nm, and particularly preferably in the range of 100 to 1000 nm. When a thickness of the gas barrier layer 102 is in the above-mentioned range, gas barrier property such as oxygen gas barrier property and water vapor barrier property is good, and gas barrier property tends to hardly reduce by bending.

A kind of the gas barrier layer 102 is not particularly limited, but the known thin film layer having gas barrier property can be appropriately utilized, and a thin film layer containing at least one of a metal oxide, a metal nitride, a metal oxynitride and a metal oxycarbide is preferable. Alternatively, as the gas barrier layer 102, a multilayer film in which two or more thin film layers described above are laminated can also be used.

From a view point that higher water vapor transmission preventing performance can be exerted, as well as from a view point of flex resistance, easiness of manufacturing and the low manufacturing cost, the gas barrier layer 102 is more preferably a layer composed of a thin film containing at least a silicon atom and an oxygen atom. Furthermore, it is preferable that the layer composed of a thin film containing a silicon atom and an oxygen atom is a thin film layer using plasma chemical vapor deposition, or a thin film formation method of forming a precursor on a substrate surface and performing plasma treatment.

The gas barrier layer 102 may be a silicon oxide-based thin film layer which contains a silicon atom, an oxygen atom and a carbon atom, and satisfies all of the following conditions (i) to (iii), in a silicon distribution curve, an oxygen distribution curve and a carbon distribution curve, each showing a relationship between a distance from a surface (surface on a side opposite to the resin substrate 101, being an interface between the inorganic polymer layer 103) of the gas barrier layer 102 in a film thickness direction of the gas barrier layer 102, and the ratio of an amount of a silicon atom (atomic ratio of silicon), the ratio of an amount of an oxygen atom (atomic ratio of oxygen) or the ratio of an amount of a carbon atom (atomic ratio of carbon), to a total amount of a silicon atom, an oxygen atom and a carbon atom.

(i) The atomic ratio of silicon, the atomic ratio of oxygen and the atomic ratio of carbon satisfy the condition represented by the expression (1):

$$\text{(Atomic ratio of oxygen)} > \text{(atomic ratio of silicon)} > \text{(atomic ratio of carbon)} \quad (1)$$

in a region of 90% or more of a film thickness of the gas barrier layer.
(ii) The carbon distribution curve has at least one extreme value.
(iii) An absolute value of a difference between a maximum value and a minimum value of the atomic ratio of carbon in the carbon distribution curve is 5 at % or more.

Such a silicon oxide-based thin film layer will be illustrated in more detail below.

In such a silicon oxide-based thin film layer, first, in a silicon distribution curve, an oxygen distribution curve and a carbon distribution curve, each showing a relationship between a distance from a surface of the layer in a film thickness direction of the layer, and the ratio of an amount of a silicon atom (atomic ratio of silicon), the ratio of an amount of an oxygen atom (atomic ratio of oxygen) and the ratio of an amount of a carbon atom (atomic ratio of carbon), to a total amount of a carbon atom, an oxygen atom and a carbon atom, (i) the atomic ratio of silicon, the atomic ratio of oxygen and the atomic ratio of carbon satisfy the condition represented by the expression (1):

$$\text{(Atomic ratio of oxygen)} > \text{(atomic ratio of silicon)} > \text{(atomic ratio of carbon)} \quad (1)$$

in a region of 90% or more (more preferably 95% or more, and further preferably 100%) of a film thickness of the layer. By the atomic ratio of silicon, the atomic ratio of oxygen and the atomic ratio of carbon satisfying the condition, gas barrier property of the gas barriering laminated film 1 becomes more excellent.

Additionally, it is necessary that such a silicon oxide-based thin film layer is such that (ii) the carbon distribution curve has at least one extreme value. In such a silicon oxide-based thin film layer, the carbon distribution curve has preferably at least two extreme values, and further preferably at least three extreme values. By the carbon distribution curve having an extreme value, reduction in gas barrier property when a film of the resulting gas barriering laminated film 1 is bent is suppressed. Additionally, when the carbon distribution curve has at least three extreme values, both of an absolute value of a difference in a distance from a surface of a silicon oxide-based thin film layer in a film thickness direction of the thin film layer at one extreme value possessed by the carbon distribution curve, and that at an extreme value adjacent to the extreme value are preferably 200 nm or less, and more preferably 100 nm or less. In addition, the "extreme value" mentioned herein refers to a local maximum value or a local minimum value of the atomic ratio of an element to a distance from a surface of a thin film layer in a film thickness direction of the thin film layer. Additionally, in the present specification, a local maximum value refers to a point at which a value of the atomic ratio of an element changes from increase to decrease when a distance from a surface of the thin film layer is changed, and in which a value of the atomic ratio of an element at a position at which a distance from a surface of the thin film layer in a film thickness direction of the thin film layer is further changed from the point by 20 nm is decreased than a value of the atomic ratio of an element at that point by 3 at % or more. Furthermore, in the present specification, the local minimum value is a point at which a value of the atomic ratio of an element is changed from decrease to increase when a distance from a surface of the thin film layer is changed, and in which a value of the atomic ratio of an element at a position at which a distance from a surface of the thin film layer in a film thickness direction of the thin film layer is further changed from the point by 20 nm is increased than a value of the atomic ratio of an element at that point by 3 at % or more.

Additionally, it is necessary that such a silicon oxide-based thin film layer is such that (iii) an absolute value of a difference between a maximum value and a minimum value of the atomic ratio of carbon in the carbon distribution curve is 5 at % or more. Additionally, in such a thin film layer, an absolute value of a difference between a maximum value and a minimum value of the atomic ratio of carbon is more preferably 6 at % or more, and further preferably 7 at % or more. When the absolute value is 5 at % or more, reduction in gas barrier property when a film of the resulting gas barriering laminated film 1 is bent is suppressed.

Additionally, in the silicon oxide-based thin film layer, the oxygen distribution curve has preferably at least one extreme value, more preferably at least two extreme values, and further preferably at least three extreme values. By the oxygen distribution curve having an extreme value, reduction in gas barrier property when a film of the resulting gas barriering laminated film 1 is bent is suppressed. Additionally, when the oxygen distribution curve has at least three extreme values like this, both of an absolute value of a difference in a distance from a silicon oxide-based thin film layer in a thickness direction of the thin film layer at one extreme value possessed by the oxygen distribution curve, and that at an extreme value adjacent to the extreme value are preferably 200 nm or less, and more preferably 100 nm or less.

Additionally, in the silicon oxide-based thin film layer, an absolute value of a difference between a maximum value and a minimum value of the atomic ratio of oxygen in the oxygen distribution curve of the layer is preferably 5 at % or more, more preferably 6 at % or more, and further preferably 7 at % or more. When the absolute value is not smaller than the above-mentioned lower limit, reduction in gas barrier property when a film of the resulting gas barriering laminated film 1 is bent is suppressed.

In the silicon oxide-based thin film layer, an absolute value of a difference between a maximum value and a minimum value of the atomic ratio of silicon in the silicon distribution curve of the layer is preferably less than 5 at %, more preferably less than 4 at %, and further preferably less than 3 at %. When the absolute value is not larger than the above-mentioned upper limit, gas barrier property of the resulting gas barriering laminated film 1 becomes more excellent.

Additionally, in the silicon oxide-based thin film layer, in the oxygen carbon distribution curve showing a relationship between a distance from a surface of the layer in a film thickness direction of the layer and the ratio of a total amount of an oxygen atom and a carbon atom to a total amount of a silicon atom, an oxygen atom and a carbon atom (atomic ratio of oxygen and carbon), an absolute value of a difference between a maximum value and a minimum value of a total of the atomic ratios of oxygen and carbon in the oxygen carbon distribution curve is preferably less than 5 at %, more preferably less than 4 at %, and further preferably less than 3 at %. When the absolute value is not larger than the above-mentioned upper limit, gas barrier property of the resulting gas barriering laminated film 1 becomes more excellent.

The silicon distribution curve, the oxygen distribution curve, the carbon distribution curve and the oxygen carbon distribution curve can be made by so-called XPS depth profile measurement, in which surface composition analysis is sequentially performed while the interior of a sample is exposed, by concurrently using measurement of X-ray Photoelectron Spectroscopy (XPS) and ion sputtering of a rare gas such as argon. A distribution curve obtained by such XPS depth profile measurement can be made, for example, with a vertical axis as the atomic ratio of each element (unit: at %) and with a horizontal axis as an etching time (sputtering time). In addition, in a distribution curve of an element with a horizontal axis as an etching time in this way, since the etching time is roughly correlated with a distance from a surface of the thin film layer in a film thickness direction of the thin film layer, as the "distance from a thin film layer in a film thickness direction of a thin film layer", a distance from a surface of a thin film layer which is calculated from a relationship between the etching rate and the etching time adopted upon XPS depth profile measurement can be adopted. Additionally, as a sputtering method which is adopted upon such XPS depth profile measurement, a rare gas ion sputtering method using argon ($Ar^+$) as an etching ion species is adopted, and it is preferable that the etching rate thereof is 0.05 nm/sec ($SiO_2$ thermally oxidized film reduced value).

Additionally, from a view point that the silicon oxide-based thin film layer which is uniform in an entire film surface and has excellent gas barrier property is formed, it is preferable that the layer is substantially uniform in a film surface direction (direction parallel with a surface of a thin film layer). In the present specification, that the silicon oxide-based thin film layer is substantially uniform in a film surface direction refers to that when the oxygen distribution curve, the carbon distribution curve and the oxygen carbon distribution curve are made by XPS depth profile measurement concerning arbitrary two measurement places of a film surface of a thin film layer, the numbers of extreme values possessed by the resulting carbon distribution curves obtained at arbitrary two measurement places are the same, and absolute values of differences between a maximum value and a minimum value of the atomic ratio of carbon in respective carbon distribution curves are the same, or have a difference within 5 at %.

Furthermore, in the silicon oxide-based thin film layer, it is preferable that the carbon distribution curve of the layer is substantially continuous. In the present specification, that the carbon distribution curve is substantially continuous means that the atomic ratio of carbon in the carbon distribution curve does not contain a portion in which the atomic ratio of carbon in the carbon distribution curve discontinuously changes, specifically, refers to the condition represented by the following mathematical expression (F1):

$$(dC/dx) \leq 0.5 \tag{F1}$$

is satisfied, in a relationship between a distance in a film thickness of at least one layer among the thin film layers from a surface of the layer (x, unit: nm) which is calculated from the etching rate and the etching time, and the atomic ratio of carbon (C, unit: at %).

Additionally, when the atomic ratio of silicon, the atomic ratio of oxygen and the atomic ratio of carbon satisfy the condition represented by the expression (1) in a region of 90% or more of a film thickness of the layer, in the silicon distribution curve, the oxygen distribution curve and the carbon distribution curve, the atomic ratio of the content of a silicon atom to a total amount of a silicon atom, an oxygen atom and a carbon atom in the layer is preferably 25 to 45 at %, and more preferably 30 to 40 at %. Additionally, the atomic ratio of the content of an oxygen atom to a total amount of a silicon atom, an oxygen atom and a carbon atom in the silicon oxide-based thin film layer is preferably 33 to 67 at %, and more preferably 45 to 67 at %. Furthermore, the atomic ratio of the content of a carbon atom to a total amount of a silicon atom, an oxygen atom and a carbon atom in the silicon oxide-based thin film layer is preferably 3 to 33 at %, and more preferably 3 to 25 at %.

A method of forming the gas barrier layer 102 is not particularly limited, but the known method which can form a film of the gas barrier layer 102 on the resin substrate 101 can be appropriately adopted, and from a view point of gas barrier property, it is preferable to adopt plasma chemical vapor deposition (plasma CVD). In addition, the plasma chemical vapor deposition may be plasma chemical vapor deposition of the Penning discharge plasma system.

Additionally, when plasma is generated in the plasma chemical vapor deposition, it is preferable that plasma discharge is generated in a space between a plurality of film-forming rolls, and it is more preferable that using one pair of film-forming rolls, the resin substrate 101 is arranged in each of the one pair of film-forming rolls, and electricity is discharged between the one pair of film-forming rolls to generate plasma. By using one pair of film-forming rolls, arranging the resin substrate 101 on the one pair of film-forming rolls, and discharging electricity between such one pair of film-forming rolls like this, while a surface part of the resin substrate 101 present on one film-forming roll is formed into a film at film formation, it becomes possible to form a surface part of the resin substrate 101 present on the other film-forming roll into a film at the same time, not only a thin film can be manufactured effectively, but also the film forming rate can be doubled, and moreover, since a film having the same structure can be formed into a film, it becomes possible to at least double an extreme value in the carbon distribution curve, and it becomes possible to effectively form a layer satisfying all of the conditions (i) to (iii).

Additionally, it is preferable to adopt the roll-to-roll system while plasma chemical vapor deposition is utilized, as a method of forming the gas barrier layer 102, from a view point of productivity. Additionally, an apparatus which can be used when the laminated film 1 is manufactured by such plasma chemical vapor deposition is not particularly limited, but an apparatus provided with at least one pair of film-forming rolls and a plasma power source, and having a configuration that electricity can be discharged between the one pair of film-forming rolls is preferable, and for example, when a manufacturing apparatus shown in FIG. 4 described later is used, it also becomes possible to manufacture the layer by the roll-to-roll system while plasma chemical vapor deposition is utilized.

<Interroll Discharge Plasma CVD Method>

Figure 4:
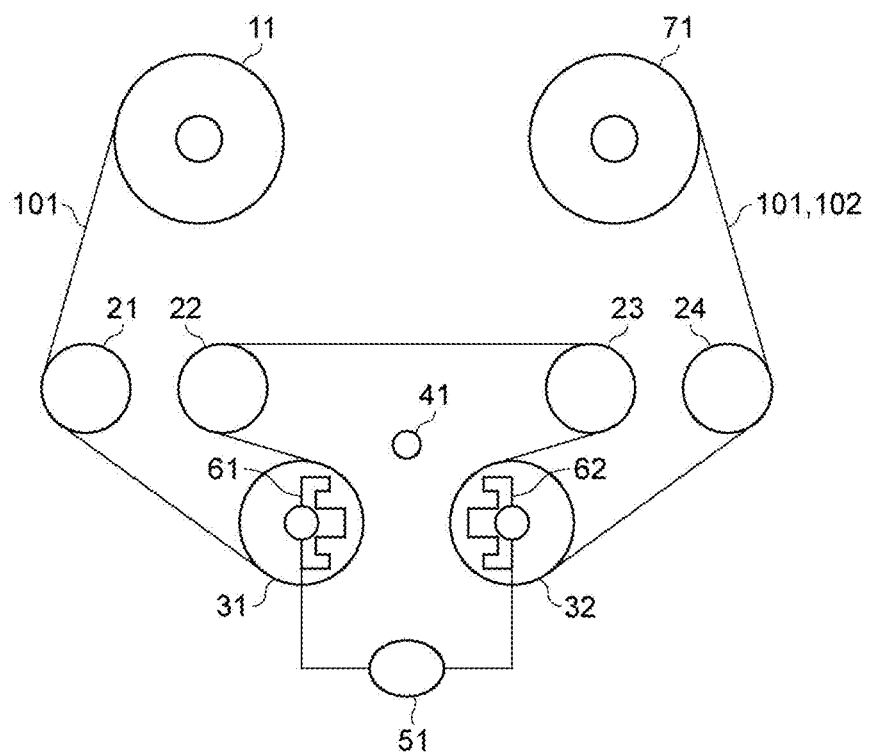
FIG. 4 is a schematic view showing one example of a suitable device for forming a gas barrier layer by an interroll discharge plasma CVD method.

Herein, referring to FIG. 4, a method which can be suitably utilized for manufacturing a film member provided with a resin substrate 101 and a gas barrier layer 102 formed on at least one surface of the resin substrate 101, by forming a gas barrier layer 102 composed of the silicon oxide-based thin film on the resin substrate 101 will be illustrated. In addition, FIG. 4 is a schematic view showing one example of a manufacturing apparatus which can be suitably used for forming the gas barrier layer 102 on the resin substrate 101 by an interroll discharge plasma CVD method of generating plasma discharge between one pair of film-forming rolls.

The manufacturing apparatus shown in FIG. 4 is provided with a delivery roll 11, conveying rolls 21, 22, 23, 24, film-forming rolls 31, 32, a gas supply tube 41, a plasma generating power source 51, magnetic field generating devices 61, 62 mounted in the interior of the film-forming rolls 31 and 32, and a winding roll 71. Additionally, in such a manufacturing apparatus, at least the film-forming rolls 31, 32, the gas supply tube 41, the plasma generating power source 51, and the magnetic field generating devices 61, 62 are arranged in a vacuum chamber not shown. Furthermore, in such a manufacturing apparatus, the vacuum chamber is connected to a vacuum pump not shown, and the pressure in the vacuum chamber can be approximately adjusted by such a vacuum pump.

In such a manufacturing apparatus, each film-forming roll is connected to the plasma generating power source 51, respectively, so that it becomes possible to make one pair of film-forming rolls (film-forming roll 31 and film-forming roll 32) function as one pair of counter electrodes. For this reason, in such a manufacturing apparatus, by supplying electric power with the plasma generating power source 51, it is possible to discharge electricity in a space between the film-forming roll 31 and the film-forming roll 32, thereby, plasma can be generated in the space between the film-forming roll 31 and the film-forming roll 32. In addition, when the film-forming roll 31 and the film-forming roll 32 are also utilized as an electrode in this way, a material and design thereof may be appropriately changed so that they can also be utilized as an electrode. Additionally, in such a manufacturing apparatus, one pair of film-forming rolls (film-forming rolls 31 and 32) are preferably arranged so that central axes thereof become approximately parallel on the same plane. By arranging one pair of film-forming rolls (film-forming rolls 31 and 32) in this way, since the film forming rate can be doubled, and furthermore, a film having the same structure can be formed, it becomes possible to at least double an extreme value on the carbon distribution curve. And, according to such a manufacturing apparatus, since it is possible to form the gas barrier layer 102 on a surface of the resin substrate 101 by a CVD method, and further, film components can also be deposited on a surface of the resin substrate 101 also on the film-forming roll 32 while film components are deposited on a surface of the resin substrate 101 on the film-forming roll 31, the gas barrier layer 102 can be effectively formed on a surface of the resin substrate 101.

Additionally, in the interior of the film-forming roll 31 and the film-forming roll 32, there are provided magnetic field generating devices 61 and 62 which are fixed so as not to be rotated even when the film-forming rolls are rotated, respectively.

Furthermore, as the film-forming roll 31 and the film-forming roll 32, the known rolls can be appropriately used. From a viewpoint that the gas barrier layer 102 is more effectively formed, it is preferable that, as such film-forming rolls 31 and 32, ones having the same diameter are used. Additionally, from a view point of the discharge condition, a space of a chamber and the like, it is preferable that a diameter of such film-forming rolls 31 and 32 is in the range of 5 to 100 cm.

Additionally, in such a manufacturing apparatus, the resin substrate 101 is arranged on one pair of film-forming rolls (film-forming roll 31 and film-forming roll 32) so that surfaces of the resin substrates 101 are opposed, respectively. By arranging the resin substrate 101 in this way, when electricity is discharged between the film-forming roll 31 and the film-forming roll 32 to generate plasma, it becomes possible to form a film on respective surfaces of the resin substrate 101 present between one pair of film-forming rolls simultaneously. That is, according to such a manufacturing apparatus, since, by CVD method, film components can be deposited on a surface of the resin substrate 101 on the film-forming roll 31, and further, film components can be deposited on the film-forming roll 32, it becomes possible to effectively form the gas barrier layer 102 on a surface of the resin substrate 101.

Additionally, as the delivery roll 11 and conveying rolls 21, 22, 23, 24 used in such a manufacturing apparatus, the known rolls can be appropriately used. Additionally, the winding roll 71 is not particularly limited, as far as it is a roll which can rewind the resin substrate 101 on which the gas barrier layer 102 is formed, but the known rolls can be appropriately used.

Additionally, as the gas supply tube 41, gas supply tubes which can supply or discharge a raw material gas and the like at a predetermined rate can be appropriately used. Furthermore, as the plasma generating power source 51, the known power sources of the plasma generating device can be appropriately used. Such a plasma generating power source 51 enables to supply electric power to the film-forming roll 31 and the film-forming roll 32 connected thereto, to utilize them as a counter electrode for discharge. Since it becomes possible to more effectively perform CVD, it is preferable to utilize a power source which can alternately invert polarity of the one pair of film-forming rolls (alternate current power source etc.) as such a plasma generating power source 51. Additionally, since it becomes possible to more effectively perform plasma CVD, a power source which can afford an application electric power of 100 W to 10 kW, and the frequency of an alternate current of 50 Hz to 500 kHz is more preferable as such a plasma generating power source 51. Additionally, as the electric field generating devices 61, 62, the known electric field generating devices can be appropriately used. Furthermore, as the resin substrate 101, in addition to the above-mentioned resin substrate 101, a resin substrate on which a thin film layer becoming a part of the gas barrier layer 102 has been formed in advance can be used. In this way, by using a resin substrate on which a thin film layer has been formed in advance, as the resin substrate 101, it is also possible to increase a thickness of the gas barrier layer 102.

By using such a manufacturing apparatus shown in FIG. 4 to appropriately adjust, for example, a kind of the raw material gas, electric power of an electrode drum of the plasma generating device, the pressure in the vacuum chamber, a diameter of the film-forming roll, as well as a conveying rate of the film, the gas barrier layer 102 composed of the silicon oxide-based thin film can be formed on a surface of the resin substrate 101. That is, by using a manufacturing apparatus shown in FIG. 4 to generate discharge between one pair of film-forming rolls (film-forming rolls 31 and 32) while a film-forming gas (raw material gas etc.) is supplied into the vacuum chamber, the film-forming gas (raw material gas etc.) is degraded with plasma, and the gas barrier layer 102 is formed by a plasma CVD method on a surface of the resin substrate 101 on the film-forming roll 31 and on a surface of the resin substrate 101 on the film-forming roll 32. In addition, upon such film formation, the resin substrate 101 is conveyed by the delivery roll 11, the film-forming roll 31 and the like, respectively, thereby, the gas barrier layer 102 composed of the silicon oxide-based thin film is formed on a surface of the resin substrate 101 by the roll-to-roll system continuous film-forming process.

As the raw material gas in the film-forming gas used in forming the gas barrier layer 102 composed of such a silicon oxide-based thin film, a raw material gas can be used by appropriately selecting it depending on a material of a thin film to be formed. As such a raw material gas, for example, an organosilicon compound containing silicon can be used. Examples of such an organosilicon compound include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. From a view point of handleability of a compound and properties such as gas barrier property of the resulting gas barrier layer 102, among these organosilicon compounds, hexamethyldisiloxane and 1,1,3,3-tetramethyldisiloxane are preferable. Additionally, these organosilicon compounds can be used alone, or can be used by combining two or more kinds.

Additionally, as the film-forming gas, in addition to the raw material gas, a reaction gas may be used. As such a reaction gas, the gas which reacts with the raw material gas to become an inorganic compound such as an oxide and a nitride can be appropriately selected and used. As the reaction gas for forming an oxide, for example, oxygen and ozone can be used. Additionally, as the reaction gas for forming a nitride, for example, nitrogen and ammonia can be used. These reaction gases can be used alone, or can be used by combining two or more kinds, and for example, when an oxynitride is formed, a reaction gas for forming an oxide and a reaction gas for forming a nitride can be used by combining them.

In the film-forming gas, in order to supply the raw material gas into the vacuum chamber, if necessary, a carrier gas may be used. Furthermore, in the film-forming gas, in order to generate plasma discharge, if necessary, the gas for discharge may be used. As such carrier gas and gas for discharge, the known ones can be appropriately used, and for example, a rare gas such as helium, argon, neon, and xenon; hydrogen can be used.

When such a film-forming gas contains the raw material gas and the reaction gas, as the ratio of the raw material gas and the reaction gas, it is preferable that the ratio of the reaction gas is not too more than the ratio of an amount of the reaction gas theoretically necessary for completely reacting the raw material gas and the reaction gas. When the ratio of the reaction gas is too excessive, it becomes impossible to obtain a thin film satisfying all of the conditions (i) to (iii). In this case, it becomes impossible to obtain excellent barrier property and flex resistance depending on a thin film layer to be formed. Additionally, when the film-forming gas contains the organosilicon compound and oxygen, it is preferable that the ratio is not greater than a theoretical oxygen amount necessary for completely oxidizing a total amount of the organosilicon compound in the film-forming gas.

By referring to an example when as the film-forming gas, a gas containing hexamethyldisiloxane (organosilicon compound: HMDSO:$(CH_3)_6Si_2O$) as a raw material gas and oxygen ($O_2$) as a reaction gas is used to manufacture a silicon-oxygen-based thin film, the preferable ratio of the raw material gas and the reaction gas in the film-forming gas and the like will be illustrated in more detail below.

When the film-forming gas containing hexamethyldisiloxane (HMDSO, $(CH_3)_6Si_2O$) as the raw material gas and oxygen ($O_2$) as the reaction gas is reacted by plasma CVD to form a silicon-oxygen-based thin film, by the film-forming gas, a reaction described in the following reaction formula (I):

$$(CH_3)_6Si_2O + 12O_2 \rightarrow 6CO_2 + 9H_2O + 2SiO_2 \qquad (I)$$

occurs, and silicon dioxide is produced. In such a reaction, an amount of oxygen necessary for completely oxidizing 1 mole of hexamethyldisiloxane is 12 moles. For this reason, when 12 moles or more of oxygen to 1 mole of hexamethyldisiloxane is contained in the film making gas to completely react them, since a uniform silicon dioxide film is formed, it becomes impossible to form a thin film layer satisfying all of the conditions (i) to (iii). For this reason, when the gas barrier layer 102 composed of the silicon oxide-based thin film is formed, from a view point of that a thin film layer satisfying all of the conditions (i) to (iii) is formed, it is preferable that an amount of oxygen is less than 12 moles being the stoichiometric ratio to 1 mole of hexamethyldisiloxane, so that the reaction of the (I) formula does not completely progress. In addition, since in the actual reaction in a plasma CVD chamber, a film is formed by supplying hexamethyldisiloxane as a raw material and oxygen as a reaction gas to a film-forming region from a gas supply portion, even when a mole amount (flow rate) of oxygen as the reaction gas is a mole amount (flow rate) which is 12 times of a mole amount (flow rate) of hexamethyldisiloxane as the raw material, actually, the reaction cannot be completely progressed, and it is thought that when oxygen is supplied at the content which is largely excessive to the stoichiometric ratio, the reaction is first completed (For example, in order to obtain oxidized silicon by complete oxidation by CVD, a mole amount (flow rate) of oxygen is around 20 times or more of a mole amount (flow rate) of hexamethyldisiloxane as the raw material, in some cases). For this reason, it is preferable that a mole amount (flow rate) of oxygen to a mole amount (flow rate) of hexamethyldisiloxane as the raw material is an amount which is not greater than a 12-fold (more preferably, 10-fold or less) amount being the stoichiometric ratio. By containing hexamethyldisiloxane and oxygen at such a ratio, a carbon atom and a hydrogen atom in hexamethyldisiloxane which have not been completely oxidized are taken into a thin film layer, it becomes possible to form a thin film layer satisfying all of the conditions (i) to (iii), and it becomes possible to make the resulting laminated film 1 exert excellent barrier property and flex resistance. In addition, when a mole amount (flow rate) of oxygen to a mole amount (flow rate) of hexamethyldisiloxane in the film-forming gas is too small, since a carbon atom and a hydrogen atom which have not been oxidized are excessively taken into a thin film layer, in this case, transparency of the gas barrier layer 102 is deteriorated, and the laminated film 1 becomes to be hardly utilized in a flexible substrate for a device requiring transparency such as organic EL devices and organic thin film solar cells. From such a view point, a lower limit of a mole amount (flow rate) of oxygen to a mole amount (flow rate) of hexamethyldisiloxane in the film-forming gas is preferably an amount larger than 0.1 times, and more preferably an amount larger than 0.5 times of a mole amount (flow rate) of hexamethyldisiloxane.

Additionally, the pressure (vacuum degree) in the vacuum chamber can be appropriately adjusted depending on a kind of the raw material gas etc., and is preferably in the range of 0.5 Pa to 50 Pa.

Additionally, in such a plasma CVD method, in order to discharge electricity between the film-forming rolls 31 and 32, electric power which is applied to an electrode drum (mounted in the film-forming rolls 31 and 32 in the present embodiment) connected to a plasma generating power source 51 can be appropriately adjusted depending on a kind of the raw material gas and the pressure in the vacuum chamber, and cannot be said as a rule, but is preferably in the range of 0.1 to 10 kW. When such an application electric power is in the above-mentioned range, particles tend to be hardly generated, additionally, an amount of heat which is produced at film formation is not increased too much, a temperature of a substrate surface at film formation is not risen, a substrate is hardly defeated with heat to generate crease, and further, there is a tendency that a film is not fused with heat to generate discharge at a large current between naked film-forming rolls to damage the film-forming rolls themselves.

A conveying rate (line rate) of the resin substrate 101 can be appropriately adjusted depending on a kind of the raw material gas and the pressure in the vacuum chamber, and is preferably in the range of 0.25 to 100 m/min, and more preferably in the range of 0.5 to 20 m/min. When the line rate is in the above-mentioned range, there is a tendency that crease of a film due to heat is hardly generated, and there is a tendency that a thickness of the formed gas barrier layer 102 is not reduced.

Like this, the gas barrier layer 102 composed of the silicon oxide-based thin film can be formed on the resin substrate 101.

Additionally, it is also preferable that the gas barrier layer 102 contains a silicon atom, an oxygen atom and a nitrogen atom, and the gas barrier layer is a silicon oxide-based layer satisfying all of the following conditions (iv) and (v):

(iv) The gas barrier layer has a second thin film layer, a first thin film layer and a third thin film layer which have different oxygen content ratios, from a resin substrate 101 side, and an average composition of a silicon atom, an oxygen atom and a nitrogen atom of the first thin film layer is in the range of 10 at %≤Si≤40 at %, 5 at %≤O≤30 at %, 50 at %≤N≤80 at %.

(v) The elemental ratio of a nitrogen atom and a silicon atom of the second and third thin film layers is in the range of the expression (2).

$$N/Si \leq 0.2 \quad (2).$$

Such a silicon oxide-based thin film layer will be illustrated in more detail below.

The gas barrier layer 102 may contain silicon, oxygen, nitrogen, and hydrogen. In this case, it is preferable that the gas barrier layer contains a compound having the general formula of $SiO_\alpha N_\beta H_\gamma$ as a main component. In this general formula, $\alpha$ is selected from a positive number less than 1, $\beta$ is selected from a positive number less than 3, and $\gamma$ is selected from a positive number less than 10, respectively. One or more of $\alpha$, $\beta$ and $\gamma$ in the general formula may be a constant value, or may be changed in a thickness direction of the gas barrier layer. Furthermore, the gas barrier layer may contain an element other than silicon, oxygen, nitrogen, and hydrogen, for example, one or more of carbon, boron, aluminum, phosphorus, sulfur, fluorine and chlorine.

In the first thin film layer of the gas barrier layer, the average elemental ratio in a film thickness direction is preferably in the range of 10 at %≤Si≤40 at %, 5 at %≤O≤30 at %, as well as 50 at %≤N≤80 at %, more preferably in the range of 15 at %≤Si≤35 at %, 10 at %≤O≤25 at %, as well as 55 at %≤N≤75 at %.

From a viewpoint of gas barrier property, it is preferable that as a method of forming the gas barrier layer 102, plasma chemical vapor deposition (PECVD method) is adopted. In addition, the plasma chemical vapor deposition may be plasma chemical vapor deposition of the Penning discharge plasma system.

From a view point of enhancing gas barrier property and transparency, a thickness of the gas barrier layer 102 is preferably 5 to 3000 nm, more preferably 10 to 2000 nm, and further preferably 100 to 1000 nm.

It is preferable that the gas barrier layer 102 has a second thin film layer, a first thin film layer, and a third thin film layer which have different oxygen content ratios from a resin substrate 101 side, from a view point of attaining both flexibility and gas barrier property.

It is preferable that the second and third thin film layers contain silicon and oxygen, and contain a compound represented by the general formula of $SiO_n$ as a main component. It is preferable that n is 1.5 to 3.0, and it is more preferably that n is 2.0 to 2.5. And, n may be a constant value, or may be changed in a thickness direction of the second and third thin film layers. It is preferable that the second and third thin film layers have the different constituted elemental ratio from that of the first thin film layer, and the elemental ratio of a nitrogen atom and a silicon atom of the second and third thin film layers is in the expression (2).

$$N/Si \leq 0.2 \tag{2}$$

In the second and third thin film layers, compositions of respective layers may be different or the same, and from a view point of stably forming the thin film layer, the layers have preferably substantially the same composition. Substantially the same composition refers to that the average elemental ratio of silicon and oxygen constituting the second thin film layer and the average elemental ratio of silicon and oxygen constituting the third thin film layer are in the range of ±5 at %.

From a view point of achieving both flexibility and gas barrier property, the second and third thin film layers have a film thickness of preferably 100 nm or less, more preferably 80 nm or less, and further preferably 50 nm or less, respectively.

From a view point of achieving both transparency and gas barrier property, in the gas barrier layer 102 (a layer of combination of second, first and third thin film layers), in infrared absorption spectrum obtained from infrared spectrometry, when the intensity ratio I'/I of the peak intensity (I) present at 810 to 880 $cm^{-1}$ and the peak intensity (I') present at 2100 to 2200 $cm^{-1}$ is obtained, the ratio is preferably in the range of the expression (3).

$$0.05 \leq I'/I \leq 0.20 \tag{3}$$

An absorption peak present at 810 to 880 $cm^{-1}$ is assigned to Si—N, and an absorption peak present at 2100 to 2200 $cm^{-1}$ is assigned to Si—H. That is, from a view point of enhancing gas barrier property, it is preferable that I'/I is 0.20 or less so that the gas barrier layer becomes to have a denser structure, and from a view point of enhancing transparency, it is preferable that I'/I is 0.05 or more so that light transmission in a visible region is not reduced.

<Inductively Coupled Plasma CVD Method>

Examples of a method of forming such a gas barrier layer 102 include a formation method by an inductively coupled plasma CVD method. The inductively coupled plasma CVD method is a procedure of forming the induction electric field by applying high frequency electric power to an induction coil to generate plasma. Since generated plasma is high density and low temperature plasma, and is stable glow discharge plasma, particularly when the resin substrate 101 having low heat resistance is used, the plasma is suitable for forming a thin film of the dense gas barrier layer 102 on the resin substrate 101.

Figure 5:
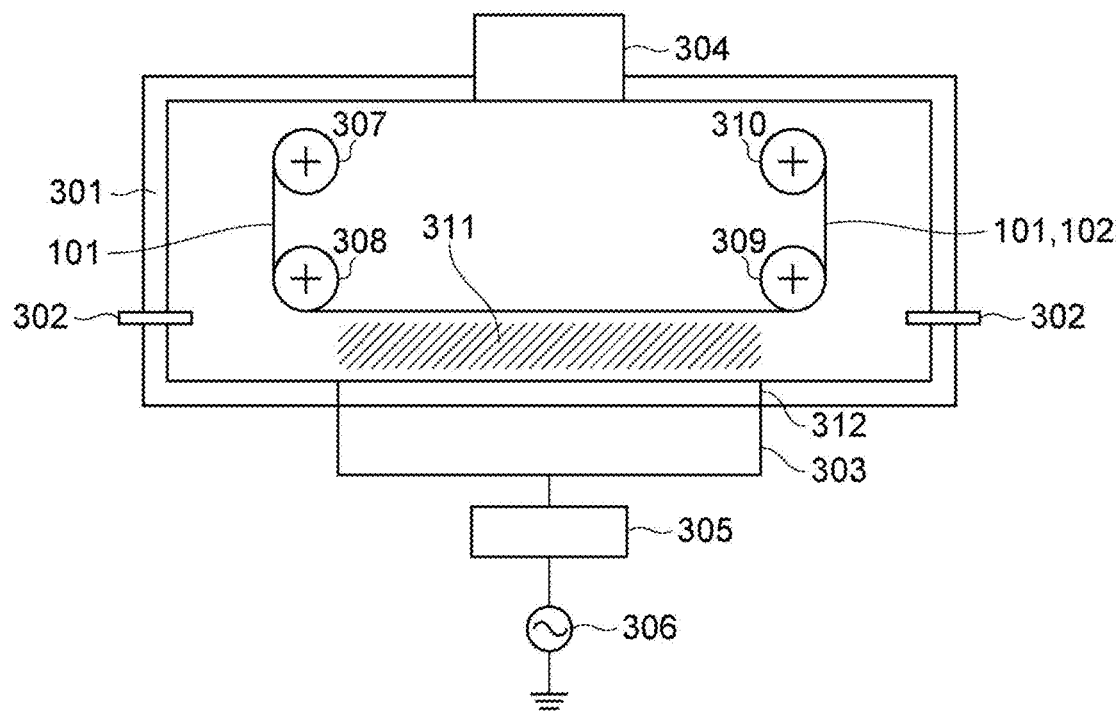
FIG. 5 is a schematic view showing one example of a suitable device for forming a gas barrier layer by an inductively coupled plasma CVD method.

The gas barrier layer 102 is formed by applying high frequency electric power to an induction coil using a general inductively coupled plasma CVD apparatus, thereby, forming the induction electric field, introducing a raw material gas to generate plasma, and forming a thin film on the resin substrate 101 (e.g. see JP-A-2006-164543). FIG. 5 is a schematic view showing one example of a suitable device for forming a gas barrier layer by an inductively coupled plasma CVD method. As shown in FIG. 5, a delivery roll 307, a winding roll 310 and conveying rolls 308, 309 are arranged in a vacuum chamber 301, and the resin substrate 101 is continuously conveyed. In addition, the delivery roll 307 and the winding roll 310 can also be inverted depending on the situation, the delivery roll can be appropriately changed to the winding roll, and the winding roll can be appropriately changed to the delivery roll. Additionally, in the vacuum chamber 301, an induction coil 303 for generating the magnetic field is provided via a rectangular inductor window 312 composed of aluminum oxide or the like, below a film formation portion (film-forming zone) 311 at which the gas barrier layer 102 is formed on the resin substrate 101, and further, a gas introduction piping 302 for introducing the gas and a vacuum pump 304 for discharging an extra gas are provided. In addition, a baffle plate for uniformizing the gas may be provided in the vicinity of a portion at which introduction and discharge of the gas are performed. Additionally, the induction coil 303 is connected to a high frequency power source 306 via a matching box 305.

The gas barrier layer 102 can be made by supplying a raw material gas though the gas introduction piping 302 using this inductively coupled plasma CVD apparatus while the resin substrate 101 is conveyed at the constant rate, generating plasma with the induction coil 303 at the film-forming portion 311, and forming a thin film layer obtained by degrading and recombining the raw material gas on the resin substrate 101.

Upon formation of the gas barrier layer 102, the resin substrate 101 is conveyed so that a conveyance direction of the resin substrate 101 is parallel with one of opposite two sides of the rectangular inductor window 312 arranged at a lower portion of the film-forming portion 311, and becomes a direction vertical to remaining opposite two sides. Thereby, upon passage through the film-forming portion 311, immediately above opposite two sides of the inductor window in a direction vertical to a conveying direction of the resin substrate 101, the plasma density is decreased, and associated therewith, a thin film layer composition after degradation and recombination of the raw material gas is changed.

The gas barrier layer 102 can be formed by using an inorganic silane-based gas, an ammonia gas, an oxygen gas and an inert gas as the raw material gas. Additionally, the gas barrier layer 102 is formed by flowing the raw material gas at a flow rate and the flow rate ratio within the range used in the normal inductively coupled plasma CVD method, respectively.

Examples of the inorganic silane-based gas include a hydrogenated silane gas and a halogenated silane gas such as a monosilane gas, a disilane gas, a trisilane gas, a dichlorosilane gas, a trichlorosilane gas, and a tetrachlorosilane gas. Among these inorganic silane-based gases, a monosilane gas and a disilane gas are preferable, from a view point of handleability of a compound and compactness of the resulting thin film layer. Additionally, these inorganic silane-based gases can be used alone, or can be used by combining two or more kinds. Examples of the inert gas include a nitrogen gas, an argon gas, a neon gas, a xenon gas and the like.

Electric power to be supplied to an electrode can be appropriately adjusted depending on a kind of the raw material gas and the pressure in the vacuum chamber 301, and for example, is set at 0.1 to 10 kW, and the frequency of an alternate current is set, for example, at 50 Hz to 100 MHz. By electric power being 0.1 kW or more, the effect of suppressing generation of particles becomes high. Additionally, by electric power being 10 kW or less, the effect of suppressing crease or damage from being generated in the resin substrate 101 due to heat received from an electrode becomes high. Furthermore, from a view point of increasing the degradation efficiency of the raw material gas, the alternate current frequency set at 1 MHz to 100 MHz may be used.

The pressure (vacuum degree) in the vacuum chamber 301 can be appropriately adjusted depending on a kind of the raw material gas and the like, and can be set, for example, at 0.1 Pa to 50 Pa.

The conveying rate of the resin substrate 101 can be appropriately adjusted depending on a kind of the raw material gas and the pressure in the vacuum chamber 301, and is preferably the same as the conveying rate of the resin substrate 101 when the resin substrate 101 is contacted with the conveying roll.

It is preferable that the gas barrier layer 102 is formed by a continuous film-forming process, and it is more preferable that while the long resin substrate 101 is continuously conveyed, the gas barrier layer 102 is continuously formed thereon.

The gas barrier layer 102 can be further formed from an upper side, by forming the resin substrate 101 while it is conveyed to the winding roll 310 from the delivery roll 307, thereafter, inverting the delivery roll 307 and the winding roll 310, and conveying the resin substrate 101 in a reverse direction. Formation can be appropriately changed depending on the desired lamination number, a film thickness, and the conveying rate.

(Inorganic Polymer Layer 103)

The inorganic polymer layer 103 is a layer which is formed using a composition containing an inorganic polymer such as polysilazane. The laminated film 1 in which such an inorganic polymer layer 103 is formed on the gas barrier layer 102 can prevent transmission of the water vapor at the high level, and at the same time, can suppress generation of dark spots over a long period of time when applied to an electron device such as organic EL element. This is because protection of a surface of the gas barrier layer 102 with the inorganic polymer layer 103 can make up for a defect such as a crack or a via hole present in the gas barrier layer 102, and at the same time, can suppress generation of a defect such as a crack in the gas barrier layer 102 when an electronic device such as an organic EL element is manufactured. From a view point that the above-mentioned effects are more sufficiently obtained, it is more preferable that the inorganic polymer layer 103 is a layer composed of a curing product of a composition containing polysilazane.

It is necessary that the arithmetic average height (Sa) of a surface of the inorganic polymer layer 103 (surface on a side opposite to the gas barrier layer 102) is 20 nm or less, and the height is preferably 15 nm or less, more preferably 10 nm or less, and further preferably 5 nm or less. When the arithmetic average height (Sa) of a surface of the inorganic polymer layer 103 is 20 nm or less, since the layer becomes a uniform layer having high surface flatness, transmission of the water vapor can be prevented at the high level, and at the same time, when the laminated film 1 is used as a supporting substrate of an electronic device such as an organic EL element, generation of dark spots can be suppressed over a long period of time. In addition, when this arithmetic average height (Sa) exceeds 20 nm, in addition to that the above-mentioned effects are not obtained, depending on the situation, when the laminated film 1 is used as a supporting substrate of an electronic device such as an organic EL element, disadvantage such as short circuit is easily generated, and light emission is not obtained in some cases. The arithmetic average height (Sa) of a surface of the inorganic polymer layer 103 can be adjusted, for example, by a method of forming the inorganic polymer layer 103 described later.

The arithmetic average height (Sa) of the inorganic polymer layer 103 can be measured utilizing a commercially available surface nature measuring machine. The arithmetic average height (Sa) in the present invention was measured using the three-dimensional non-contact surface shape measuring system (manufactured by Ryoka Systems Inc., trade name: MM557N-M100 Type) at objective lens: magnification 10, intermediate lens: magnification 1, camera: XC-ST30 1/3 type (manufactured by Sony Corporation), visual field: 468.0 μm×351.2 μm, measurement mode: Smooth Phase, central wavelength of optical filter: 520 nm. When distortion such as curling had been generated in the laminated film, measurement was performed at the condition under which distortion had been removed using a plate for easy adhesion.

In the inorganic polymer layer 103, it is necessary that the ammonia ($NH_3$) gas generation amount per unit mass of the inorganic polymer layer when the laminated film containing the inorganic polymer layer is accommodated in a sample chamber, and the interior of the sample chamber is heated at 85° C. for 1 hour while the humidified air at 25° C. and 85% RH is flown through the sample chamber is 5000 mass ppm or less, and the amount is preferably 3500 mass ppm or less, more preferably 3000 mass ppm or less, further preferably 1000 mass ppm or less, particularly preferably 550 mass ppm or less, and extremely preferably 150 mass ppm or less. On the other hand, the $NH_3$ gas generation amount is preferably 50 mass ppm or more, and more preferably 80 mass ppm or more. The $NH_3$ gas generation amount from the inorganic polymer layer 103, which is measured by the above-mentioned method, becomes an index of an amount of a nitrogen gas which is easily released from the inorganic polymer layer 103 under the high temperature high humidity environment, although it is present in the inorganic polymer layer 103. And, when this $NH_3$ gas generation amount is large, water vapor transmission preventing property is adversely influenced, and at the same time, when an electronic device such as an organic EL element is manufactured using the laminated film 1, and at storage after manufacturing, a defect or the like is easily generated due to influence of $NH_3$ gas generation. When this $NH_3$ gas generation amount is 5000 mass ppm or less, transmission of the water vapor can be prevented at the high level, and at the same time, when the laminated film 1 is used as a supporting device of an electronic device such as an organic EL element, generation of dark spots can be suppressed over a long period of time. In addition, when this $NH_3$ gas generation amount exceeds 5000 mass ppm, in addition to that the above-mentioned effects are not obtained, depending on the situation, when the laminated film 1 is used as a supporting substrate of an electronic device such as an organic EL element, an electrode material and a luminescent material are damaged, disadvantage is easily generated, and light emission property is deteriorated, and light emission is not obtained, in some cases. On the other hand, when the $NH_3$ gas generation amount is 50 mass ppm or more, there is a tendency that the inorganic polymer layer excellent in compactness and flex resistance can be obtained. The $NH_3$ gas generation amount of the inorganic polymer layer 103 can be adjusted, for example, by a method of forming the inorganic polymer layer 103 described later.

Figure 6:
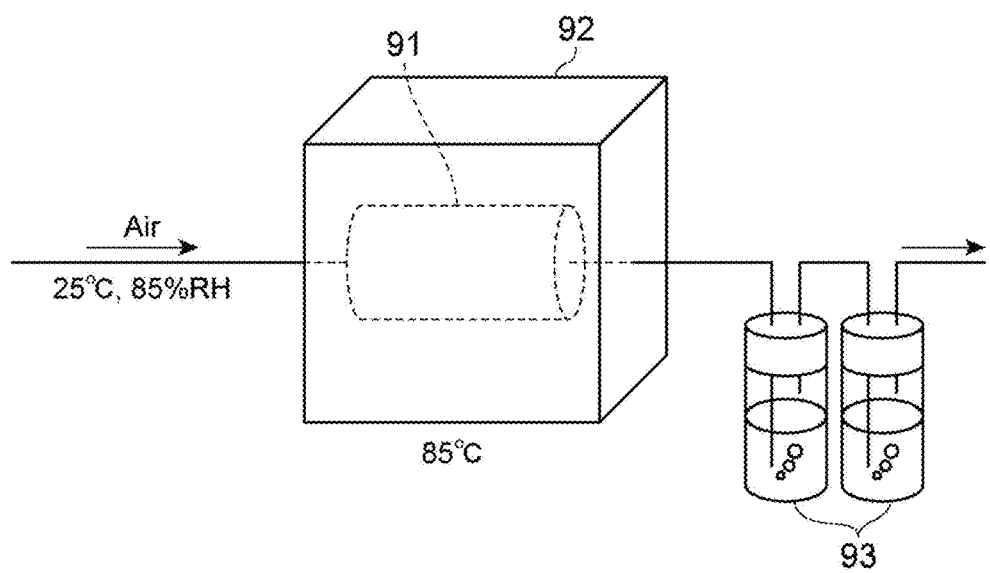
FIG. 6 is a schematic view showing one example of a device which measures the $NH_3$ gas generation amount.

The NH$_3$ gas generation amount can be measured, for example, using a device shown in FIG. 6. A specific example of a measurement method using the device shown in FIG. 6 is shown below. First, a coating liquid containing an inorganic polymer is coated on the gas barrier layer on the resin substrate on which the gas barrier layer is formed, so that a thickness after drying on a hot plate at 90° C. for 1 minute becomes 500 nm, and curing treatment is performed to form an inorganic polymer layer. A sample after curing treatment is stored under the inert atmosphere (for example, under the dry nitrogen atmosphere etc.) so that the inorganic polymer layer does not react with the water vapor in the atmospheric air. This laminated film with the inorganic polymer layer is taken out from a storage box under the inert atmosphere, and accommodated rapidly in a glass chamber 91 (volume 940 ml), the cleaning level of which has been confirmed, and the high purity air at 25° C. which has been humidified to 85% RH is flown through the glass chamber 91 at a flow rate of 1500 mL/min. Within 5 minutes after flowing initiation, the interior of the glass chamber 91 is heated using an oven 92 while the humidified air is flown, and a temperature is raised from room temperature to 85° C. at a temperature raising speed of 10° C./min or more, followed by heating at 85° C. for 1 hour. Gas components which are generated from the sample during heating for 1 hour are captured in a two-stage coupled impinger 93 containing an absorbing liquid (e.g. pure water etc.). The absorbing liquid after gas components capturing is measured by ion chromatography (IC). The ammonium ion concentration (g/mL) in the absorbing liquid is multiplied by an absorbing liquid amount (mL), the mass (g) of an ammonium ion captured in the absorbing liquid is obtained, converted into ammonia, and divided by the mass (g) of the inorganic polymer layer formed on the laminated film, thereby, the NH$_3$ gas generation amount per unit mass (mass ppm) is calculated. In addition, molecular weight conversion can be calculated with an ammonium ion molecular weight: 18 g/mol, and an ammonia molecular weight: 17 g/mol.

A thickness of the inorganic polymer layer 103 is preferably in the range of 5 to 3000 nm, more preferably in the range of 10 to 2000 nm, further preferably in the range of 10 to 1000 nm, and particularly preferably in the range of 20 to 1000 nm. When a thickness of the inorganic polymer layer 103 is in the above-mentioned range, there is a tendency that water vapor transmission preventing property and dark spot resistance are hardly reduced, and there is a tendency that flex resistance is hardly reduced.

The inorganic polymer 103 can be adjusted to a desired film thickness by one time coating, or can also be adjusted to a desired film thickness by plural times coating. When coating is performed plural times, it is effective that curing treatment is performed every one time coating, from a view point of maintaining a diffusion path of the gas which is generated by curing, and making up for a defect such as a crack.

The inorganic polymer layer 103 can be formed by coating a coating liquid containing the inorganic polymer such as polysilazane on the gas barrier layer 102, drying it, and curing-treating a formed coated film. As the coating liquid, a liquid obtained by dissolving or dispersing the inorganic polymer in a solvent can be used. The concentration of the inorganic polymer in the coating liquid may be appropriately adjusted depending on a thickness of the inorganic polymer layer 103 and requirement from a pot life of the coating liquid, and is usually 0.2 to 35% by mass.

Specific examples of polysilazane being the inorganic polymer include perhydropolysilazane (PHPS) and the like.

As the solvent, a solvent which is not reacted with the inorganic polymer to be used, is suitable for dissolving or dispersing the inorganic polymer, and has no adverse influence on the gas barrier layer 102 can be appropriately selected and used. Examples of the solvent include hydrocarbon solvents such as an aliphatic hydrocarbon, an alicyclic hydrocarbon, and an aromatic hydrocarbon, a halogenated hydrocarbon solvent, ethers such as aliphatic ether, and alicyclic ether. Examples of the solvent include more specifically hydrocarbons such as pentane, hexane, cyclohexane, toluene, and xylene, halogenated hydrocarbons such as methylene chloride, and trichloroethane, and ethers such as dibutyl ether, dioxane, and tetrahydrofuran. These solvents may be used by mixing two or more kinds.

When polysilazane is used as the inorganic polymer, in order to promote modification to silicon oxynitride, an amine catalyst, or a metal catalyst such as a Pt compound such as Pt acetylacetonate, a Pd compound such as Pd propionate, and a Rh compound such as Rh acetylacetonate can also be added to the coating liquid.

An addition amount of the catalyst to polysilazane is preferably 0.1 to 10% by mass, more preferably 0.2 to 5% by mass, and further preferably 0.5 to 2% by mass based on a total amount of the coating liquid. By an addition amount of the catalyst being in the above-mentioned range, excessive silanol formation, reduction in the film density, increase in a film defect due to rapid progression of the reaction and the like can be suppressed.

Examples of a method of coating the coating liquid on the gas barrier layer 102 include a spin coating method, a roller coating method, a flow coating method, an ink jet method, a spray coating method, a printing method, a dip coating method, a flow casting film-forming method, a bar coating method, a gravure printing method and the like.

Drying may be performed at the condition under which a solvent in the coating liquid can be removed. Alternatively, for example, coating and drying of the coating liquid on a heated hot plate may be performed simultaneously.

As a method of curing-treating the formed coated film, for example, a method which can cure the inorganic polymer in the coated film such as a plasma CVD method, an ion injection treating method, an ultraviolet irradiation method, a vacuum ultraviolet irradiation method, an oxygen plasma irradiation method, and a heat-treating method can be used. Among them, it is preferable to use a method of irradiating vacuum ultraviolet light (VUV light) having the wavelength of 200 nm or less to the coated film as the curing-treating method. Additionally, a method of irradiating vacuum ultraviolet light to the coated film is more preferable when polysilazane is used as the inorganic polymer.

In the case where a vacuum ultraviolet irradiation method is used as a method of curing-treating the coated film containing polysilazane, when the coated film is irradiated with vacuum ultraviolet ray, at least a part of polysilazane is modified to silicon oxynitride represented by $SiO_xN_y$. Herein, when perhydropolysilazane having a structure represented by —(SiH$_2$—NH—)$_n$— is used as polysilazane, in order to be x>0 upon modification to $SiO_xN_y$, an oxygen source becomes necessary, and oxygen and moisture which were taken into the coated film in a manufacturing process become an oxygen source.

In the composition of $SiO_xN_y$, from a relationship of atomic bonding of Si, O, N, fundamentally, x and y become within the range of 2x+3y=4. In the state of y=0 at which oxidation has completely progressed, a silanol group becomes to be contained in the coated film, and x becomes within the range of 2<x<2.5 in some cases. In addition, since it is usually unlikely that nitration of Si progresses more than oxidation of Si, y is fundamentally 1 or less.

By irradiation with vacuum ultraviolet ray, silicon oxynitride is generated from perhydropolysilazane, and further, the reaction mechanism for generating silicon oxide is thought as follows:

(1) Dehydrogenation, and Formation of Si—N Bond Associated Therewith

It is thought that a Si—H bond and a N—H bond in perhydropolysilazane are relatively easily cut by excitation with vacuum ultraviolet irradiation, and are recombined as Si—N under the inert atmosphere (dangling bond of Si is formed in some cases). That is, perhydropolysilazane is cured as the $SiN_y$ composition without being oxidized. In this case, cutting of a polymer main chain is not generated. Cutting of a Si—H bond and a N—H bond is promoted by the presence of a catalyst or heating. Cut H is released to the outside of a film as $H_2$.

(2) Formation of Si—O—Si Bond by Hydrolysis and Dehydration Condensation

A Si—N bond in perhydropolysilazane is hydrolyzed with water, and a polymer main chain is cut to form Si—OH. Two Si—OHs are dehydration condensed to form a Si—O—Si bond and cured. This is a reaction which is also generated in the atmospheric air, and during vacuum ultraviolet irradiation under the inert atmosphere, it is thought that the water vapor which is generated from the resin substrate as outgas due to heat of irradiation becomes a main moisture source. When moisture becomes excessive, Si—OH which is not completely dehydration-condensed remains, and becomes a cured film having low gas barrier property, which is shown by the composition of $SiO_{2.1}$~$SiO_{2.3}$.

(3) Direct Oxidation Due to Singlet Oxygen, Formation of Si—O—Si Bond

When a suitable amount of oxygen exists under the atmosphere during vacuum ultraviolet irradiation, singlet oxygen having very strong oxidizing power is formed. H and N in perhydropolysilazane are substituted with O to form a Si—O—Si bond, and a product is cured. It is thought that recombination of a bond is generated by cutting of a polymer main chain, in some cases.

(4) Oxidation Associated with Si—N Bond Cutting by Vacuum Ultraviolet Irradiation and Excitation Since the energy of vacuum ultraviolet ray is higher than the binding energy of Si—N in perhydropolysilazane, a Si—N bond is cut, and when an oxygen source such as oxygen, ozone and water exists in its surroundings, it is thought that oxidation generates a Si—O—Si bond or a Si—O—N bond. It is thought that by cutting of a polymer main chain, recombination of a bond is generated in some cases.

Adjustment of the composition of silicon oxynitride of a layer which is obtained by subjecting the coated film containing polysilazane to vacuum ultraviolet irradiation can be performed by controlling the oxidized state by appropriately combining the oxidation mechanisms of the (1) to (4).

In vacuum ultraviolet irradiation, illuminance of vacuum ultraviolet ray on a coated film surface, which is received by a coated film containing polysilazane, is preferably in the range of 1 to 100000 mW/cm², and more preferably in the range of 30 to 200 mW/cm². When this illuminance is 1 mW/cm² or more, there is no fear of reduction in the modification efficiency, and when the illuminance is 100000 mW/cm² or less, ablation is not generated in the coated film, and the resin substrate 101 is not damaged, and accordingly, this is preferable.

In vacuum ultraviolet irradiation, an integrated light amount (integrated irradiation energy amount) of vacuum ultraviolet ray which is irradiated to a coated film containing polysilazane is preferably in the range of 1.0 to 100 mJ/cm²/nm, more preferably in the range of 1.5 to 30 mJ/cm²/nm, further preferably in the range of 2.0 to 20 mJ/cm²/nm, and particularly preferably in the range of 5.0 to 20 mJ/cm²/nm in the following expression which was standardized with a film thickness of the inorganic polymer layer. When this standardized integrated light amount is 1.0 mJ/cm²/nm or more, modification can be sufficiently performed, and at the same time, the $NH_3$ gas generation amount in the resulting inorganic polymer layer 103 can be reduced. On the other hand, when this standardized integrated light amount is 100mJ/cm²/nm or less, the modification condition does not become the excessive modification condition, and generation of a crack in the inorganic polymer layer 103 and thermal deformation of the resin substrate 101 can be prevented. Upon preparation into a desired film thickness, also when the inorganic polymer layer 103 is cured plural times, it is preferable that each layer has the above-mentioned range of the standardized integrated light amount.

$$\text{Standardized integrated light amount } (\text{mJ/cm}^2/\text{nm}) = \frac{\text{Integrated light amount (mJ/cm}^2)}{\text{Film thichness after drying of inorganic polymer layer (nm)}} \quad [\text{Mathematic 1}]$$

As a vacuum ultraviolet light source, a rare gas excimer lamp is preferably used. Since an atom of a rare gas such as Xe, Kr, Ar and Ne does not chemically bind to make a molecule, it is called inert gas.

However, an excited atom of a rare gas having obtained the energy by discharge or the like can bind with other atom to make a molecule. When the rare gas is xenon, $$e+Xe \rightarrow Xe^*$$

$$Xe^*+2Xe \rightarrow Xe_2^*+Xe$$

$$Xe_2^* \rightarrow Xe+Xe+h\nu(172 \text{ nm}),$$

and when $Xe_2^*$ being an excited excimer molecule is transitioned to the ground state, it emits excimer light at the wavelength of 172 nm.

Examples of the characteristic of the excimer lamp include that since radiation is concentrated on the one wavelength, and little other than necessary light is radiated, the efficiency is high. Additionally, since extra light is not radiated, a temperature of a subject can be kept low. Furthermore, since start and restart do not need the time, instantaneous switching on and switching off are possible.

In order to obtain excimer light, a method of using inductor barrier discharge is known. Inductor barrier discharge is discharge called micro discharge, which is generated in a gas space by disposing the gas space between both electrodes through an inductor such as transparent quartz, and applying high frequency high voltage of a few tens kHz to an electrode, and is very thin similar to thunder, and since when a streamer of micro discharge arrives at a tube wall (inductor), charge is accumulated on an inductor surface, micro discharge disappeared.

Inductor barrier discharge is discharge in which this micro discharge is expanded on an entire tube wall, and generation and disappearance are repeated. For this reason, flickering of light which can also be confirmed with naked eyes is generated. Additionally, since a streamer at a very high temperature locally arrives at a tube wall directly, there is also a possibility that deterioration in a tube wall is accelerated.

As a method of effectively obtaining excimer light emission, in addition to inductor barrier discharge, electrodeless field discharge is also possible. This is electrodeless field discharge due to capacitive coupling, and is also called RF discharge, as another name. The lamp and the electrode and arrangement thereof may be fundamentally the same as those of inductor barrier discharge, but the high frequency wave which is applied between both electrodes is switched on at a few MHz. Since electrodeless field discharge can afford spatially or temporarily uniform discharge like this, the lamp of a long life having no flickering is obtained.

In the case of inductor barrier discharge, since micro discharge is generated only between electrodes, in order to perform discharge in an entire discharge space, a whole external surface of an external electrode must be covered, and in order to extract light to the outside, the external electrode must transmit light.

For this reason, an electrode obtained by preparing a thin metal wire into a network is used. Since in this electrode, an as thin as possible wire is used so as not to shield light, the electrode is easily damaged with ozone which is generated with vacuum ultraviolet light, in the oxygen atmosphere. In order to prevent this, it becomes necessary to make surroundings of the lamp, that is, the interior of the irradiation device in the atmosphere of an inert gas such as nitrogen, and provide a window of synthetic quartz to extract irradiated light. The window of synthetic quartz is not only expensive consumable goods, but also causes loss of light.

Since a double cylindrical lamp has an external diameter of around 25 mm, a difference in a distance to an irradiation surface cannot be neglected between beneath a lamp axis and a lamp side, generating a great difference in illuminance. Accordingly, even if lamps are aligned closely, a uniform illuminance distribution is not obtained. When prepared into an irradiation device provided with a window of synthetic quarts, a distance in the oxygen atmosphere can be made to be uniform, and a uniform illuminance distribution is obtained.

When electrodeless field discharge is used, it is not necessary that an external electrode is prepared into a network. Only by providing an external electrode at apart of a lamp external surface, glow discharge is expanded to an entire discharge space. In an external electrode, an electrode which also functions as a light reflection plate, usually made of an aluminum block, is used on a rear surface of a lamp. However, since an external diameter of a lamp is large like the case of inductor barrier discharge, in order to obtain a uniform illuminance distribution, synthetic quartz becomes necessary.

The greatest characteristic of a tubule excimer lamp resides in a simple structure. Both ends of the quartz tube are closed, and simply, the gas for performing excimer light emission is sealed the interior.

An external diameter of a tube of the tubule lamp is around 6 to 12 mm, and when the external diameter is too large, high voltage becomes necessary for starting.

As the form of discharge, any of inductor barrier discharge and electrodeless field discharge can be used. A shape of the electrode is such that a surface contacting with the lamp may be a flat surface, but by adopting a shape matched to a curved surface of the lamp, the lamp can be fixed firm, and at the same time, discharge is more stabilized due to adherence of the electrode to the lamp. Alternatively, when a curved surface is formed to be a mirror surface with aluminum, this also becomes a light reflecting plate.

Since a Xe excimer lamp radiates a ultraviolet ray having the short wavelength of 172 nm at the simple wavelength, it is excellent in the luminous efficiency. Since this excimer light has a large oxygen absorption coefficient, it can generate a radical oxygen atom species and ozone at the high concentration with a minor amount of oxygen.

Additionally, it is known that the light energy at the short wavelength of 172 nm has the high ability to dissociate a bond of an organic substance. By this active oxygen and ozone, and the high energy possessed by ultraviolet radiation, modification of a polysilazane layer can be realized in a short time.

Accordingly, this enables irradiation to an organic material or a plastic substrate which easily undergoes shortening of the process time and reduction in a facility area associated with high throughput, and damage due to heat, as compared with a low pressure mercury lamp emitting the wavelength of 185 nm or 254 nm, or plasma washing.

Since the excimer lamp has the high light generation efficiency, it can be switched on by supply of low electric power. Additionally, since it does not emit light of the long wavelength which becomes cause for temperature rise due to light irradiation, and irradiates the energy at an ultraviolet region, that is, at a short wavelength range, it has the characteristic that rise in a surface temperature of a subject to be irradiated is suppressed. For this reason, the excimer lamp is suitable for modification-treating a material having a flexible film such as PET, which is said to easily undergo thermal influence.

Since when oxygen exists, vacuum ultraviolet ray is absorbed by oxygen, the efficiency at a step of irradiating ultraviolet ray is easily reduced, and accordingly, it is preferable that vacuum ultraviolet irradiation is performed in the state where the oxygen concentration is as low as possible. That is, the oxygen concentration at vacuum ultraviolet irradiation is preferably in the range of 10 to 100000 volume ppm, more preferably in the range of 50 to 50000 volume ppm, and further preferably in the range of 100 to 10000 volume ppm.

It is preferable that at vacuum ultraviolet irradiation, a dried inert gas is used as the gas filling the irradiation environment, and inter alia, it is preferable that a dried nitrogen gas is used from a view point of the cost. The oxygen concentration can be adjusted by measuring a flow rate of an oxygen gas and an inert gas which are introduced into the irradiation environment, and changing the flow rate ratio.

In the inorganic polymer layer 103, the shrinkage rate of a layer thickness after curing treatment to a film thickness before curing treatment ({(film thickness before curing treatment−layer thickness after curing treatment)/film thickness before curing treatment}×100) is preferably less than 10%, more preferably 9.5% or less, and further preferably 9.0% or less. On the other hand, the shrinkage rate is preferably 1.0% or more, and more preferably 2.0% or more. When the shrinkage rate is in the above mentioned range, an amount of distortion such as curling which is generated in the laminated film due to the shrinkage stress can be suppressed, and the laminated film can be applied to a preparation process when used in organic EL element device illumination and display. The shrinkage rate can be controlled by adjusting a kind of the inorganic polymer to be used (e.g. a kind of polysilazane), and the curing condition (for example, when vacuum ultraviolet ray is used, the light intensity and the irradiation time thereof).

(Structure etc. of Laminated Film)

A whole thickness of the laminated film 1 is preferably 10 to 300 μm, and more preferably 20 to 150 μm. When a whole thickness of the laminated film 1 is in the above-mentioned range, in the case where the laminated film 1 is a long substrate, crease or twisting becomes difficult to be generated in the laminated film 1 at a step of manufacturing an electronic device such as the organic EL element, control of the laminated film 1 tends to be easy, and since an amount of light to be absorbed by the laminated film 1 is not increased, light emission from a light emitting layer to the outside tends to hardly decrease.

Additionally, when the laminated film 1 is utilized in organic EL device illumination and display, it is preferable that the laminated film 1 has a lower value of the yellowness YI, and the value is more preferably 10 or less, and further preferably 5 or less. Such yellowness YI can be measured using spectrophotometry which can calculate tristimulus values XYZ as a measurement device, in accordance with JIS K 7373: 2006.

Additionally, when the laminated film 1 is utilized in organic EL device illumination and display, the laminated film 1 having high total light transmission is preferable. From such a view point, the total light transmission of the laminated film 1 is preferably 80% or more, and further preferably 85% or more. In addition, such total light transmission can be measured using a transmission measuring device having an integrating sphere as a measuring device, in accordance with JIS K7375:2008.

Furthermore, when the laminated film 1 is used in a substrate of an organic EL element for an image display device, the laminated film 1 having the low haze is preferable, and the haze is more preferably 10% or less, and further preferably 5% or less. On the other hand, the laminated film 1 is used in a substrate for the organic EL element for illumination, from intended use thereof, since not only the haze is not cared too much, but also when a light emitting surface of organic EL emits light ununiformly in the state where concentration difference or spots are generated, the high haze conversely shades off ununiform light emission, from such a view point, the laminated film having the high haze can also be suitably utilized. Like this, the laminated film 1 can be used while properties thereof are appropriately changed to suitable design, depending on intended use of the organic EL element.

Additionally, as such a laminated film 1, a sufficiently flexible laminated film (having sufficient flexibility) is preferable. By preparing into such a flexible film, the laminated film can be more suitably utilized in intended use requiring flexibility.

[Organic EL Element]

Figure 2:
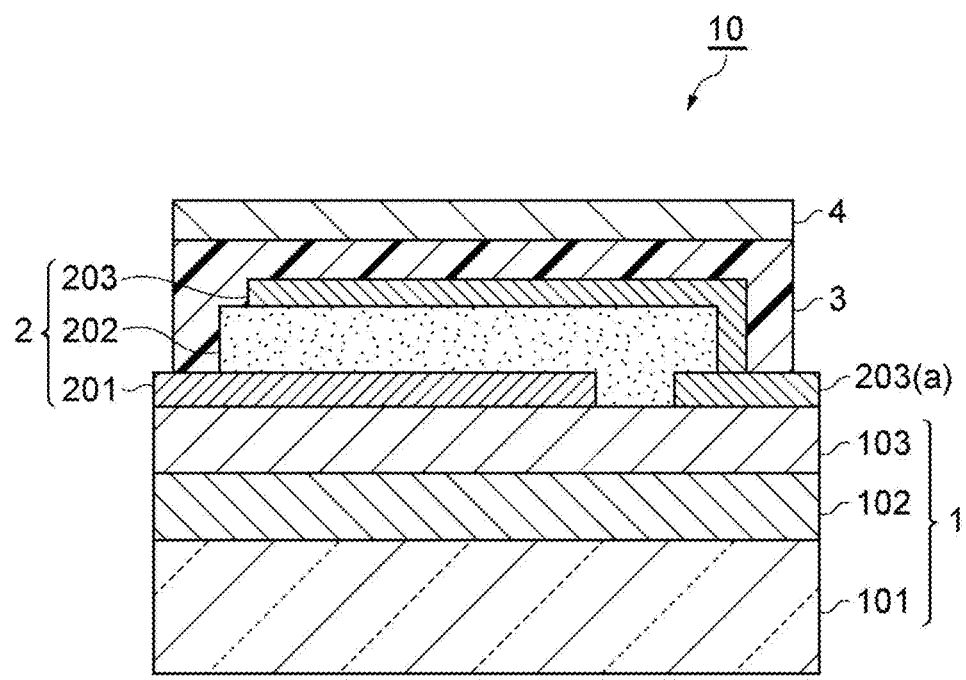
FIG. 2 is a schematic cross-sectional view showing one embodiment of an organic electroluminescent element.
Figure 3:
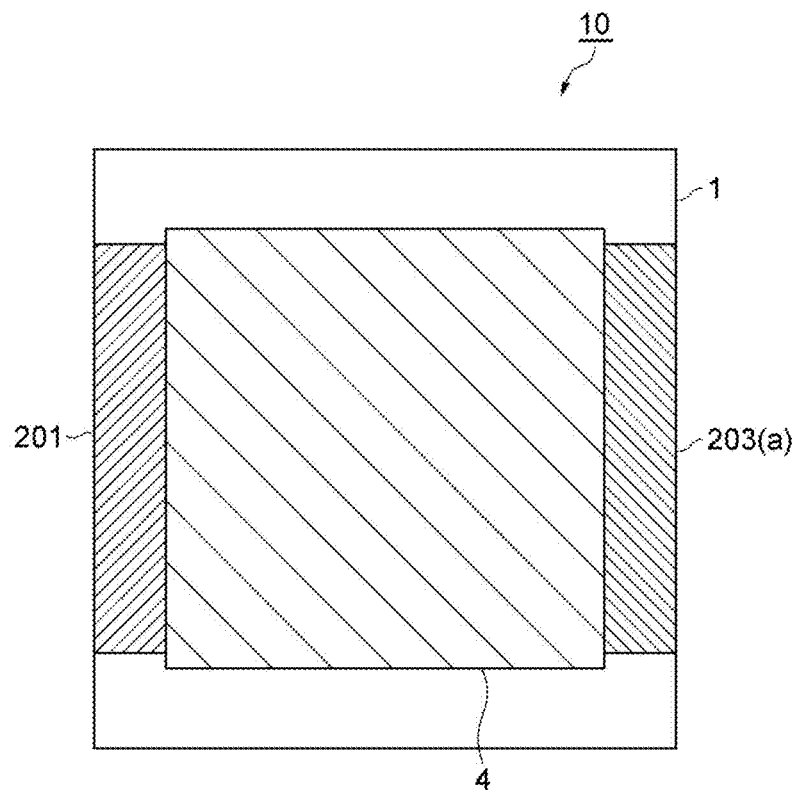
FIG. 3 is a top view schematically showing a structure when the organic electroluminescent element shown in FIG. 2 is seen from a sealing substrate side.

FIG. 2 is a schematic cross-sectional view showing one embodiment of the organic EL element, and FIG. 3 is a top view schematically showing a structure when the organic EL element shown in FIG. 2 is seen from a sealing substrate side. As shown in FIG. 2, the organic EL element 10 of the present embodiment is provided with a laminated film 1 as a supporting substrate (transparent supporting substrate), a light emitting element portion 2, a sealing material layer 3, and a sealing substrate 4. Each member will be illustrated in detail below. In addition, as the laminated film 1, the laminated film 1 of the present embodiment provided with the resin substrate 101, the gas barrier layer 102 and the inorganic polymer layer 103 is used. Additionally, as the laminated film 1, colorless transparent one is used, and as described above, one having the total light transmission of preferably 80% or more, and more preferably 85% or more is used.

(Light Emitting Element Portion 2)

The light emitting element portion 2 is provided with one pair of electrodes (first electrode 201 and second electrode 203) and a light emitting layer 202 arranged between the electrodes. One pair of electrodes 201, 203 and the light emitting layer 202 arranged between the electrodes, which constitute such a light emitting element portion 2, are not particularly limited, but the electrodes and the light emitting layers which are utilized in the known organic EL element can be appropriately utilized. For example, examples include that an electrode on a light extraction surface side is transparent or translucent, and a low-molecular and/or high-molecular organic light emitting material are (is) used in the light emitting layer. Such first electrode 201, light emitting layer 202, and second electrode 203 will be illustrated in detail below.

<First Electrode 201>

The first electrode 201 is an electrode of one of an anode and a cathode. In the light emitting element portion 2 of the embodiment shown in FIG. 2, as the first electrode 201, an electrode showing optical transparency (transparent or translucent electrode) is used, in order to enable emission of light which is radiated from the light emitting layer 202 to the outside of the light emitting element portion 2. In such an embodiment shown in FIG. 2, the first electrode 201 showing optical transparency is utilized as an anode.

As such a first electrode 201 (anode) exhibiting optical transparency, a thin film of a metal oxide, a metal sulfide and a metal can be used, and an electrode having higher electrical conductivity and light transmission is suitably used. Examples of such an electrode composed of a thin film of a metal oxide, a metal sulfide and a metal include thin films composed of indium oxide, zinc oxide, tin oxide, ITO (Indium Tin Oxide), Indium Zinc Oxide (abbreviation: IZO), gold, platinum, silver, and copper. As such a thin film of a metal oxide, a metal sulfide and a metal, a thin film composed of ITO, IZO, or tin oxide is more preferable. A method of producing such a thin film of a metal oxide, a metal sulfide or a metal is not particularly limited, but the known method can be appropriately adopted, and for example, a vacuum deposition method, a sputtering method, an ion plating method, a plating method and the like can be adopted.

Additionally, as such a first electrode 201, an organic transparent electrically conductive film of polyaniline or a derivative thereof, polythiophene or a derivative thereof or the like may be used. Additionally, such a first electrode 201 may be a film-like electrode (A) composed of a resin having optical transparency, and a wire-like conductor having electrical conductivity which is arranged in the resin having optical transparency. As such a resin having optical transparency, a resin having higher light transmission is preferable, and examples thereof include polyolefin-based resins such as low density or high density polyethylene, an ethylene-propylene copolymer, an ethylene-butene copolymer, an ethylene-hexene copolymer, an ethylene-octene copolymer, an ethylene-norbornene copolymer, an ethylene-dimethano-octahydronaphthalene copolymer, polypropylene, an ethylene-vinyl acetate copolymer, an ethylene-methyl methacrylate copolymer, and an ionomer resin; polyester-based resins such as polyethylene terephthalate, polybutylene terephthalate, and polyethylene naphthalate; nylon-6, nylon-6,6, meta-xylenediamine-adipic acid polycondensate; amide-based resins such as polymethylmethacrylimide; acrylic-based resins such as polymethyl methacrylate; polystyrene, styrene-acrylonitrile-based resins such as a styrene-acrylonitrile copolymer, a styrene-acrylonitrile-butadiene copolymer, and polyacrylonitrile; hydrophobized cellulose-based resins such as cellulose triacetate, and cellulose diacetate; halogen-containing resins such as polyvinyl chloride, polyvinylidene chloride, polyfluorinated vinylidene, and polytetrafluoroethylene; a hydrogen-bonding resins such as polyvinyl alcohol, an ethylene-vinyl alcohol copolymer, and a cellulose derivative; engineering plastic-based resins such as a polycarbonate resin, a polysulfone resin, a polyether sulfone resin, a polyether ether ketone resin, a polyphenylene oxide resin, a polymethylene oxide resin, a polyarylate resin, and a liquid crystal resin. In addition, from a view point that when an organic layer is manufactured from such a resin constituting the first electrode 201 on an anode by a coating method, the resin becomes difficult to be dissolved in a coating liquid, as such a resin, a thermosetting resin, a photocurable resin, and a photoresist material are suitably used.

Additionally, as the wire-like conductor, one having a small diameter is preferable. A diameter of the wire-like conductor is preferably 400 nm or less, more preferably 200 nm or less, and further preferably 100 nm or less. Since such a wire-like conductor diffracts or scatters light passing through the first electrode 201, it enhances the haze value of the first electrode 201, and at the same time, reduces transmission of light, but by using the wire-like conductor having a diameter equivalent to the wavelength of visible light or smaller than the wavelength of visible light, the haze value to visible light can be suppressed low, and at the same time, transmission of light can be improved. Additionally, when a diameter of the wire-like conductor is too small, since the resistance becomes high, 10 nm or more is preferable. In addition, when the organic EL element is used in an illumination device, since the haze value of the first electrode 201 which is high to some extent can illuminate a wide range, the first electrode 201 having the high haze value is suitably used, in some cases. Like this, optical properties of the first electrode 201 can be appropriately set depending on devices in which the organic EL element is used.

Additionally, the number of wire-like conductors contained in such a film-like electrode (A) may be one, or plural. It is preferable that such a wire-like conductor forms a network structure in the electrode (A). That is, it is preferable that in the electrode (A), one or plural wire-like conductors is (are) arranged so as to complicatedly entangle in the whole resin to form a network structure (a structure in which one wire-like conductor is complicatedly entangled, or a network structure which is formed by arranging a plurality of wire-like conductors in contact with each other to expand two-dimensionally or three-dimensionally). Furthermore, such a wire-like conductor may be, for example, curve-shaped, or needle-shaped. By mutually contacting curve-shaped and/or needle-shaped conductors to form a network structure, the first electrode 201 having low volume resistivity can be realized. This network structure may be regular, or may not be regular. By the wire-like conductor forming a network structure, volume resistivity of the first electrode 201 can also be reduced.

It is preferable that at least a part of the wire-like conductors is arranged in the vicinity of a surface on a side opposite to the laminated film 1 on which the first electrode 201 is arranged (in the present embodiment, a surface on a side of the light emitting layer 202). By arranging wire-like conductors like this, the resistance of a surface portion of the first electrode 201 can be reduced. In addition, as a material of such a wire-like conductor, for example, a metal having the low resistance such as silver, gold, copper, aluminum and an alloy thereof is suitably used. The wire-like conductor can be produced, for example, by the method of N. R. Jana, L. Gearheart and C. J. Murphy (Chm. Commun., 2001, p 617-p 618), and the method by C. Ducamp-Sanguesa, R. Herrera-Urbina, and N. Figlarz (J. Solid State Chem., Vol. 100, 1992, p 272-p 280). Alternatively, such an electrode (A) may have the same configuration as that of the electrode described in JP-A-2010-192472, and as a method of producing it, the method described in JP-A-2010-192472 can be adopted.

Additionally, a film thickness of such a first electrode 201 (anode) is appropriately set in view of required properties and simplicity of a step, and for example, is 10 to 10000 nm, preferably 20 to 1000 nm, and more preferably 50 to 500 nm.

<Light Emitting Layer 202>

The light emitting layer 202 may be a layer composed of the known material which can be utilized in the light emitting layer (layer having the function of emitting light) of the organic EL element, a material thereof and the like are not particularly limited, but the layer is preferably a light emitting layer composed of an organic material. Such a light emitting layer composed of an organic material is not particularly limited, but for example, is preferably a layer formed of an organic substance emitting fluorescence or phosphorescence (a low-molecular compound and a high-molecular compound) as a luminescent material, and a dopant assisting this. In addition, the high-molecular compound mentioned herein is one having a number average molecular weight of polystyrene conversion of $1 \times 10^3$ or more. In addition, there is no particular reason why an upper limit of such a number average molecular weight is defined, but an upper limit of a number average molecular weight of polystyrene conversion is usually preferably $1 \times 10^8$ or less.

Examples of such a luminescent material (organic substance emitting fluorescence or phosphorescence) include a dye-based material, a metal complex-based material, a high-molecular-based material and the like. Examples of such a dye-based material include a cyclopentamine derivative, a tetraphenylbutadiene derivative compound, a triphenylamine derivative, an oxadiazole derivative, a pyrazoloquionline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a pyrazoline dimer and the like.

Additionally, examples of the metal complex-based material include metal complexes which has a central metal of aluminum, zinc, beryllium or the like, or a rare earth metal such as terbium, europium, and dysprosium, and a ligand of an oxadiazole, thiadiazole, phenylpyridine, phenylbenzimidazole or quinoline structure, such as an alumiquinolinol complex, a benzoquinolinolberyllium complex, a benzoxazolylzinc complex, a benzothiazolezinc complex, an azomethylzinc complex, a porphyrinzinc complex, and a europium complex.

Furthermore, examples of the high-molecular-based material include a polyparaphenylenevinylene derivative, a polythiophene derivative, a polyparaphenylene derivative, a polysilane derivative, a polyacetylene derivative, a polyfluorene derivative, a polyvinylcarbozole derivative, a material obtained by polymerizing the plastid or the metal complex-based light emitting material, and the like.

Among such luminescent materials, examples of a material emitting blue light include a distyrylarylene derivative, an oxadiazole derivative, and a polymer thereof, a polyvinyl carbazole derivative, a polyparaphenylene derivative, a polyfluorene derivative and the like. Among them, a polyvinylcarbozole derivative, a polyparaphenylene derivative and a polyfluorene derivative which are a polymer material are preferable.

Additionally, examples of a luminescent material emitting green light include a quinacridone derivative, a coumarin derivative, and a polymer thereof, a polyparaphenylenevinylene derivative, a polyfluorene derivative and the like. Among them, a polyparaphenylenevinylene derivative, a polyfluorene derivative and the like which are a polymer material are preferable.

Additionally, examples of a luminescent material emitting red light include a coumarin derivative, a thiophene ring compound, and a polymer thereof, a polyparaphenylenevinylene derivative, a polythiophene derivative, a polyfluorene derivative and the like. Among them, a polyparaphenylenevinylene derivative, a polythiophene derivative, a polyfluorene derivative and the like which are a polymer material are preferable.

Additionally, a process for producing such a fluorescent material is not particularly limited, but the known process can be appropriately adopted, and for example, the process described in JP-A-2012-144722 may be adopted.

Additionally, in the light emitting layer 202, it is preferable that a dopant is added for the purpose of improving the light emitting efficiency or changing the light emitting wavelength. Examples of such a dopant include a perylene derivative, a coumarin derivative, a rubrene derivative, a quinacridone derivative, a squalium derivative, a porphyrin derivative, a styryl-based dye, a tetracene derivative, a pyrazolone derivative, decacyclene, phenoxazone and the like. In addition, it is preferable that a thickness of such a light emitting layer is usually about 2 to 200 nm.

A method of forming such a light emitting layer 202 is not particularly limited, but the known method can be appropriately adopted. Among the method of forming such a light emitting layer 202, it is preferable to form the layer by a coating method. The coating method is preferable in that a production process can be simplified, and in that productivity is excellent. Examples of such a coating method include a casting method, a spin coating method, a bar coating method, a blade coating method, a roll coating method, gravure printing, screen printing, an inkjet method and the like. When the light emitting layer is formed using the coating method, first, a composition in the solution state containing a light emitter and a solvent is prepared as a coating liquid, this coating liquid is coated on a desired layer or electrode by the above-mentioned predetermined coating method, and further, this is dried, thereby, the light emitting layer having a desired film thickness can be formed.

<Second Electrode 203>

The second electrode 203 is an electrode having polarity reverse to that of the first electrode 201, and is arranged opposed to the first electrode 201. In addition, in the embodiment shown in FIG. 2, the second electrode is a cathode.

A material of such a second electrode 203 (cathode) is not particularly limited, but the known material can be appropriately utilized, and it is preferable to utilize a material which has a small work function, easily injects electrons into the light emitting layer 202, and has high electrical conductivity. Additionally, as in the embodiment shown in FIG. 2, in the organic EL element having a configuration that light is extracted from an anode side, from a view point that light which is radiated from the light emitting layer is reflected toward an anode side at a cathode to effectively extract light, a material having high visible reflectivity is preferable as a material of the second electrode 203 (cathode).

As a material of such a second electrode 203 (cathode), for example, an alkali metal, an alkaline earth metal, a transition metal and Group 13 metals of Periodic Table can be used. More specifically, as a material of the second electrode 203 (cathode), metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of the metals, alloys of one or more of the metals, and one or more of gold, silver, platinum, copper, manganese, titanium, cobalt, nickel, tungsten, and tin, or graphite or graphite intercalation compound can be suitably utilized. Examples of such an alloy include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy and the like.

Additionally, as the second electrode 203 (cathode), a transparent electrically conductive electrode composed of an electrically conductive metal oxide and an electrically conductive organic substance can also be used. Specifically, examples of the electrically conductive metal oxide include indium oxide, zinc oxide, tin oxide, ITO, and IZO, and examples of the electrically conductive organic substance include polyaniline or a derivative thereof, polythiophene or a derivative thereof and the like. In addition, the second electrode 203 (cathode) may be composed of a laminate in which two or more layers are laminated. Alternatively, a so-called electron injection layer may be used as a cathode.

A film thickness of such a second electrode 203 (cathode) is not particularly limited, but can be appropriately designed in view of required properties and simplicity of a step, and is preferably 10 nm to 10 µm, more preferably 20 nm to 1 µm, and further preferably 50 nm to 500 nm. Examples of a method of preparing such a second electrode 203 (cathode) include a vacuum deposition method, a sputtering method, and a laminating method of thermocompression bonding a metal thin film.

In addition, in the embodiment shown in FIG. 2, the second electrode 203 (cathode) is electrically connected to a connecting part (extracting electrode 203 (a)) so that it can be electrically connected to the outside. Herein, in the embodiment shown in FIG. 2, the extracting electrode 203 (a) is formed of the same material as that of the first electrode 201. Such an extracting electrode 203 (a) can be appropriately produced and designed by known method, and for example, when the first electrode 201 is formed, a part of the extracting electrode 203 (a) is concurrently formed by pattern film formation, thereby, the second electrode 203 can be easily produced.

<Relationship Between Laminated Film 1 and Light Emitting Element Portion 2>

The light emitting element portion 2 provided with the above-mentioned one pair of electrodes 201, 203 and the light emitting layer 202 arranged between the electrodes is arranged on a surface of the gas barriering laminated film (supporting substrate) 1, and one electrode (first electrode 201) of the light emitting element portion 2 is laminated on the resin substrate 101 of the laminated film 1 via the gas barrier layer 102 and the inorganic polymer layer 103. Herein, as shown in FIG. 3, the light emitting element portion 2 can be arranged on only a part of a surface of the laminated film 1. By arranging one electrode (first electrode 201) between the resin substrate 101 of the laminated film 1 via the gas barrier layer 102 and the inorganic polymer layer 103 like this, it becomes possible to prevent the water vapor from entering the light emitting element portion 2 from a laminated film 1 side at the higher level. In addition, when one electrode (first electrode 201) of the light emitting element portion 2 is directly arranged on a surface of the resin substrate 101, entrance of water into the light emitting element portion 2 occurs due to the moisture contained in the resin substrate 101, and it becomes difficult to sufficiently suppress deterioration.

<Sealing Material Layer 3>

The sealing material layer 3 is a layer which is arranged on the laminated film 1 so as to seal the light emitting element portion 2, and a layer composed of the known sealing material (e.g. a sheet of an adhesive material having sufficiently low water vapor transmittability) can be appropriately utilized. That is, such a sealing material layer 3 is a layer which seals the light emitting element portion 2 so as to cover the surroundings thereof 2 on the laminated film 1 so that the light emitting layer 202 does not contact with the outside air. In addition, upon such sealing, in order to function as a light emitting element, as shown in FIG. 2 and FIG. 3, one pair of electrodes are sealed except for a connecting part for electrically connecting to the outside (For example, a connecting wiring and a part of a so-called extracting electrode, and in the embodiment shown in FIG. 2 and FIG. 3, a part of an extracting electrode 203 (a) connected to a second electrode 203 as well as a part which can be contacted with the outside air of the first electrode 201 (one part of the first electrode which is extracted to the outside) correspond to a connecting part).

In view of adhesiveness, heat resistance, and barrier property to moisture, oxygen etc., a sealing material which forms such a sealing material layer 3 can be appropriately formed using the previously known optional suitable material, and for example, in addition to an epoxy resin, a silicone resin, an acrylic resin, a methacrylic resin etc., a curing adhesive such as the previously known thermosetting adhesive, photocurable adhesive and two-pack mixing curable adhesive can be appropriately utilized. In addition, in order to form such a sealing material layer 3, a sheet-like sealing material may be utilized. Such a sheet-like sealing material can be formed by appropriately molding the material by the known method.

Additionally, a thickness of such a sealing material layer 3 is not particularly limited, but may be such a thickness that can cover the light emitting element portion 2 so that it can be sealed, and is preferably 1 to 120 μm, more preferably 3 to 60 μm, further preferably 5 to 50 μm, and particularly preferably 10 to 40 μm. When a thickness of such a sealing material layer (thickness between the laminated film 1 and the sealing substrate 4) is in the above-mentioned range, the mechanical strength is hardly reduced, and when the pressure is added to the sealing substrate 4 from the outside, a possibility that the light emitting element portion 2 is pushed to cause short circuit between the first electrode 201 and the second electrode 203 tends to reduce, and there is a tendency that an amount of the moisture which enters the sealing material layer 3 through an end thereof is hardly increased, and deterioration of organic EL becomes difficult to be generated.

<Sealing Substrate 4>

The sealing substrate 4 is a substrate which is arranged on the sealing material layer 3, and is used from a view point that the water vapor and oxygen are effectively suppressed from entering the interior of the light emitting element portion 2 from on a surface on a side opposite to a side contacting with the laminated film 1 of the sealing material layer 3, and from a view point that heat releasability is improved. In addition, since the sealing material layer 3 is arranged so as to cover the light emitting element portion 2, in the embodiment shown in FIG. 2, it follows that the sealing material layer 3 exists between the light emitting element portion 2 and the sealing substrate 4. Like this, in the embodiment shown in FIG. 2, the sealing substrate 4 is arranged on the sealing material layer 3 so that the light emitting element portion 2 and the sealing material layer 3 intervene between the laminated film 1 and the sealing substrate 4.

As such a sealing substrate 4, one composed of the known material can be appropriately utilized, and for example, a sealing substrate composed of a plate or a foil of a metal such as copper and aluminum or an alloy containing the metal, a glass, a plastic substrate in which a barrier layer is laminated and the like can be suitably utilized. Additionally, such a sealing substrate 4 may be a rigid substrate, or may be a flexible substrate.

Additionally, from a view point of heat releasability and easiness of working, it is preferable that a material of such a sealing substrate 4 is composed of any metal material of copper, copper alloy, aluminum and aluminum alloy. Examples of the sealing substrate 4 composed of such a metal material include an aluminum foil and a copper foil, as preferable one.

Furthermore, among such a sealing substrate 4, a copper foil produced by an electrolytic method is more preferable from a view point that there is a tendency that pinholes are reduced more, and the higher effect is obtained in a point of prevention of entrance of the water vapor and oxygen. That is, by using such a copper foil produced by an electrolytic method (copper foil) in the sealing substrate 4, it becomes possible to more effectively seal the organic EL element, thereby, it becomes possible to more sufficiently suppress the organic EL element from being deteriorated, due to entrance of the moisture through pinholes of the copper foil. In addition, such an electrolytic method is not particularly limited, but the known electrolytic method which can produce a copper foil can be appropriately adopted.

Additionally, a thickness of such a sealing substrate 4 is not particularly limited, but is preferably 5 to 100 μm, and more preferably 8 to 50 μm. When a thickness of such a sealing substrate 4 is in the above-mentioned range, it becomes possible to sufficiently suppress generation of pinhole at manufacturing of the sealing substrate 4, there is a tendency that it becomes possible to suppress the moisture from entering thought pinhole to deteriorate the organic EL element at the higher level, additionally, flexibility of the sealing substrate 4 is hardly reduced, and as a result, there is a tendency that a radius of curvature when the organic EL element is bent is increased and flexibility of the organic EL element is hardly reduced.

Additionally, a distance between the sealing substrate 4 and the light emitting element portion 2 (thickness of the sealing material layer 3 between the light emitting element portion 2 and the sealing substrate 4: a distance between a surface contacting with the sealing material layer 3 of the second electrode 203 and a surface contacting with the sealing material layer 3 of the sealing substrate 4) in a thickness direction (direction vertical to the sealing substrate 4) is preferably 5 to 120 μm, and more preferably 10 to 60 μm. When a distance between such a sealing substrate 4 and the light emitting element portion 2 is in the above-mentioned range, contact between the second electrode 203 and the sealing substrate 4 can be suppressed at bending, there is a tendency that it becomes possible to sufficiently suppress generation of short circuit, and there is a tendency that light emission quality is hardly reduced. Additionally, there is a tendency that even when the second electrode 203 is pushed by application of the pressure due to irregularities of a surface of the sealing substrate 4 at bending, since it is hardly contacted with the first electrode 201, a possibility of short circuit is reduced. Additionally, a surface contacting with the outside air of the sealing material layer 3 is hardly increased, an amount of entrance of the water vapor from a transverse direction of the sealing material layer 3 (direction vertical to a thickness direction: direction parallel with a surface of the laminated film 1) is hardly increased, and there is a tendency that it becomes possible to suppress reduction in a storage life of the organic EL element at the higher level.

Additionally, it is preferable to utilize such a sealing substrate 4 so that surface roughness of a surface on a sealing material layer 3 side of the sealing substrate 4 becomes a value smaller than surface roughness of the other surface (external surface roughness) of the sealing substrate 4, based on standard of the arithmetic average roughness Ra of JIS B 0601-1994. When the arithmetic average roughness of a surface on a sealing material layer 3 side of such a sealing substrate 4 is in the above-mentioned range, in the case where the organic EL element is bent, there is a tendency that since the light emitting element portion 2 is hardly damaged by an irregular shape on a surface (irregular shape present due to roughness of a surface) of the sealing substrate 4 etc., short circuit becomes difficult to occur. In addition, it is also considered that treatment of smoothing surface roughness of such a sealing substrate 4 is performed, but when such smoothing treatment (e.g. polishing and surface treatment) is performed, the cost is increased, the economic efficiency at manufacturing of the organic EL element is reduced, not only large scale production becomes difficult, but also when a surface is smoothed too much, adherability with the sealing material layer 3 is reduced, and peeling is easily generated, and there is a tendency that it becomes difficult to use the organic EL element over a long period of time. Additionally, there is also a tendency that when a surface of the sealing substrate 4 becomes smooth, the radiation rate is reduced, and heat release becomes difficult.

In addition, a method of laminating such sealing material layer 3 and sealing substrate 4 is not particularly limited, but the known method can be appropriately adopted, and for example, a method of coating a sealing material composed of a material having adhesiveness so as to cover the light emitting element portion 2 on the laminated film 1, laminating the sealing substrate 4 thereon, and thereafter, sticking the sealing material to laminate the sealing material layer 3 and the sealing substrate 4 on the laminated film 1 may be adopted. Alternatively, a method of forming a layer composed of a sealing material on the sealing substrate 4 in advance, and pushing the sealing substrate 4 on which a layer composed of such a sealing material is formed while the layer composed of the sealing material is enabled to cover the surroundings of the light emitting element portion 2, and laminating the sealing material layer 3 and the sealing substrate 4 on the laminated film 1 may be adopted.

Preferable embodiments of the laminated film of the present invention and the organic EL elements using it were illustrated referring to the drawings, but the laminated film of the present invention and the organic EL element using it are not limited to the above-mentioned embodiments.

For example, in embodiments shown in FIG. 1 and FIG. 2, the laminated film 1 has a structure in which the resin substrate 101, the gas barrier layer 102 and the inorganic polymer layer 103 are laminated in this order, but the laminated film 1 may be further provided with, for example, a primer-coated layer, a heat sealing resin layer or the like, if necessary, on a surface of the resin substrate 101 and/or the inorganic polymer layer 103, in addition to the above-mentioned layers.

Additionally, since higher gas barrier property is obtained, a gas barrier layer 102 may be further formed on a surface on a side opposite to the gas barrier layer 102 of the resin substrate 101, and an inorganic polymer layer 103 may be further formed on the gas barrier layer 102. That is, the gas barrier layer 102 and the inorganic polymer layer 103 may be formed on both sides of the resin substrate 101.

Additionally, in the embodiment of the organic EL element shown in FIG. 2, the light emitting element portion 2 is provided with one pair of electrodes (first electrode 201, second electrode 203) and the light emitting layer 202 arranged between the electrodes, but the light emitting element portion 2 may be appropriately provided with other layers, in such a range that the object and the effect of the present invention are not deteriorated. Such other layers will be illustrated below.

As other layers other than one pair of electrodes (first electrode 201, second electrode 203) and the light emitting layer 202, which can be utilized in such an organic EL element, the known layers utilized in the organic EL element can be appropriately utilized, and examples include a layer provided between a cathode and a light emitting layer, and a layer provided between an anode and a light emitting layer. Examples of such a layer provided between a cathode and a light emitting layer include an electron injection layer, an electron transport layer, a hole block layer and the like. In addition, when only one layer is provided between a cathode and a light emitting layer, such a layer is an electron injection layer. Additionally, when two or more layers are provided between a cathode and a light emitting layer, a layer contacting with a cathode is named as electron injection layer, and other layers are named as electron transport layer.

Such an electron injection layer is a layer having the function of improving the efficiency of injecting electrons from a cathode, and the electron transport layer is a layer having the function of improving electron injection from the electron injection layer or an electron transport layer nearer a cathode. In addition, when the electron injection layer or the electron transport layer has the function of arresting transport of holes, these layers are called hole block layer in some cases. Concerning possession of the function of arresting transport of holes, the arresting effect can be confirmed by preparing an element which flows only a hole current, and measuring decrease in a value of the current.

Examples of the layer provided between an anode and a light emitting layer include a so-called hole injection layer, hole transport layer, electron block layer and the like. Herein, when only one layer is provided between an anode and a light emitting layer, such a layer is a hole injection layer, and when two or more layers are provided between an anode and a light emitting layer, a layer contacting with an anode is named as hole injection layer, and other layers are named as hole transport layer or the like. Such a hole injection layer is a layer having the function of improving the efficiency of hole injection from a cathode, and the hole transport layer is a layer having the function of improving hole injection from a hole injection layer or a hole transport layer nearer an anode. Additionally, when a hole injection layer, or a hole transport layer has the function of arresting transport of electrons, these layers are named as electron block layer in some cases. In addition, concerning possession of the function of arresting transport of electrons, the arresting effect can be confirmed, for example, by preparing an element which flows only an electron current, and measuring decrease in a value of the current.

Additionally, examples of a structure of the light emitting element portion provided with such other elements include a structure in which an electron transport layer is provided between a cathode and a light emitting layer, a structure in which a hole transport layer is provided between an anode and a light emitting layer, a structure in which an electron transport layer is provided between a cathode and a light emitting layer, and a hole transport layer is provided between an anode and a light emitting layer and the like. As such a structure, specifically, structures of the following a) to d) can be exemplified.
a) Anode/light emitting layer/cathode (embodiment shown in FIG. 2)
b) Anode/hole transport layer/light emitting layer/cathode
c) Anode/light emitting layer/electron transport layer/cathode
d) Anode/hole transport layer/light emitting layer/electron transport layer/cathode
(Herein, / indicates that respective layers are laminated adjacent to each other. The same applies hereinafter.)

Herein, the hole transport layer is a layer having the function of transporting holes, and the electron transport layer is a layer having the function of transporting electrons. In addition, the electron transport layer and the hole transport layer are collectively called as charge transport layer. Additionally, the light emitting layer, the hole transport layer, and the electron transport layer may be such that two or more layers are used independently, respectively. Additionally, among charge transport layers provided adjacent to an electrode, a layer having the function of improving the efficiency of charge injection from an electrode, and having the effect of reducing a driving voltage of an element is generally called as particularly charge injection layer (hole injection layer, electron injection layer) in some cases.

Furthermore, in order to improve adherability with an electrode or improve charge injection from an electrode, the charge injection layer or an insulating layer having a film thickness of 2 nm or less may be provided adjacent to an electrode, and in order to improve adherability of an interface or prevent mixing of an interface, a thin buffer layer may be inserted into an interface of the charge transport layer or the light emitting layer. Like this, the order and the number of layers which are laminated on the light emitting element portion, and a thickness of each layer can be appropriately designed and used, in view of the light emitting efficiency and the element life.

Examples of the light emitting element portion (organic EL element portion) on which such a charge injection layer (electron injection layer, hole injection layer) is provided include a portion having a structure in which a charge injection layer is provided adjacent to a cathode, a portion having a structure in which a charge injection layer is provided adjacent to an anode, and the like.

As a structure of such a light emitting element portion (organic EL element portion), for example, structures of the following e) to p) are exemplified.
e) Anode/charge injection layer/light emitting layer/cathode
f) Anode/light emitting layer/charge injection layer/cathode
g) Anode/charge injection layer/light emitting layer/charge injection layer/cathode
h) Anode/charge injection layer/hole transport layer/light emitting layer/cathode
i) Anode/hole transport layer/light emitting layer/charge injection layer/cathode
j) Anode/charge injection layer/hole transport layer/light emitting layer/charge injection layer/cathode
k) Anode/charge injection layer/light emitting layer/charge transport layer/cathode
l) Anode/light emitting layer/electron transport layer/charge injection layer/cathode
m) Anode/charge injection layer/light emitting layer/electron transport layer/charge injection layer/cathode
n) Anode/charge injection layer/hole transport layer/light emitting layer/charge transport layer/cathode
o) Anode/hole transport layer/light emitting layer/electron transport layer/charge injection layer/cathode
p) Anode/charge injection layer/hole transport layer/light emitting layer/electron transport layer/charge injection layer/cathode In addition, when the light emitting layer and other layer (e.g. charge transport layer described later etc.) are laminated, it is desirable that before provision of the light emitting layer, the hole transport layer is formed on an anode, or after provision of the light emitting layer, the electron transport layer is formed. Additionally, a material of these other layers is not particularly limited, but the known materials can be appropriately utilized, and a process for producing them is also not particularly limited, but the known processes can be appropriately utilized. For example, examples of a hole transporting material for forming a hole transport layer, which is a layer provided between an anode and a light emitting layer, or between a hole injection layer and a light emitting layer, include triphenylamines, bises, a heterocyclic compound, a representative of which is a pyrazoline derivative and a porphyrin derivative, and as a polymer, polycarbonate, a styrene derivative, polyvinylcarbazole, polysilane and the like having the above-mentioned monomer on a side chain. Additionally, a film thickness of such a hole transport layer is preferably around 1 nm to 1 µm.

Additionally, examples of a material for forming a hole injection layer (layer which can be provided between an anode and a hole transport layer, or between an a node and a light emitting layer) among the charge injection layer includes phenylamine, star burst-type amine, phthalocyanine, oxides such as vanadium oxide, molybdenum oxide, ruthenium oxide, and aluminum oxide, amorphous carbon, polyaniline, a polythiophene derivative and the like.

Furthermore, examples of a material for forming an electron transport layer being a layer which can be provided between a light emitting layer and a cathode, or between a light emitting layer and an electron injection layer include substances which form a generally stable radical anion, and has the large ionization potential, such as oxadiazoles, and an aluminum quinolinol complex. Specifically, examples include a 1,3,4-oxadiazole derivative, a 1,2,4-triazole derivative, an imidazole derivative and the like. A film thickness of the electron transport layer is preferably around 1 nm to 1 µm.

Additionally, as an electron injection layer (layer provided between an electron transport layer and a cathode, or between a light emitting layer and a cathode) among the charge injection layer, for example, depending on a kind of the light emitting layer, an electron injection layer composed of a monolayer structure of a Ca layer, or an electron injection layer composed of a laminated structure of a layer formed of any one or two or more of a metal of Periodic Table Group IA and Group IIA except for Ca, and having a work function of 1.5 to 3.0 eV, and an oxide, a halide or an oxycarbide of the metal, and a Ca layer can be provided. Examples of the metal of Periodic Table Group IA having a work function of 1.5 to 3.0 eV, or the oxide, the halide or the oxycarbide thereof include lithium, lithium fluoride, sodium oxide, lithium oxide, lithium carbonate and the like. Additionally, examples of the metal of Periodic Table Group IIA except for Ca having a work function of 1.5 to 3.0 eV, or the oxide, the halide or the oxycarbide thereof include strontium, magnesium oxide, magnesium fluoride, strontium fluoride, barium fluoride, strontium oxide, magnesium carbonate and the like. The electron injection layer is formed by a deposition method, a sputtering method, a printing method or the like. A film thickness of the electron injection layer is preferably around 1 nm to 1 µm.

EXAMPLES

The present invention will be illustrated more specifically below based on Examples and Comparative Examples, but the present invention is not limited to the following Examples.

[Assessment Method]

<Gas Barrier Property>

Gas barrier property of the laminated film was assessed by Water Vapor Transmission Rate (WVTR). The water vapor transmission rate was calculated by a calcium corrosion method (method described in JP-A-2005-283561) under the condition of a temperature of 40° C. and humidity of 90% RH. That is, the laminated film was drying-treated, and deposited with metal calcium, and further deposited with metal aluminum, and finally stuck with a glass using a sealing resin to obtain a sealed sample, and concerning the sample, increase due to change with time in a corrosion point on a laminated film side under the condition of a temperature of 40° C. and humidity of 90% RH was examined by image analysis to calculate the water vapor transmission rate. In addition, upon calculation of such water vapor transmission rate, a corrosion point was photographed with a microscope, the image was fetched into a personal computer to binarize an image of a corrosion point, and a corrosion area was obtained by calculation, thereby, the water vapor transmission rate was calculated. As a value of this water vapor transmission rate is smaller, gas barrier property is more excellent.

<Film Thickness>

A film thickness of the gas barrier layer and the inorganic polymer layer was measured by the following method. That is, the gas barrier layer was formed on the resin substrate, and the inorganic polymer layer was formed on the gas barrier layer, respectively, a level difference of resin substrate (non-film-formed part)/gas barrier layer, and gas barrier layer/inorganic polymer layer was measured using a surface roughness measuring instrument (manufactured by Kosaka Laboratory Ltd., trade name: Surfcorder ET200), and a film thickness of the gas barrier layer and that of the inorganic polymer layer were obtained.

<Arithmetic Average Height (Sa)>

The arithmetic average height (Sa) showing surface smoothness of the laminated film was measured using the tree-dimensional non-contact surface shape measuring system (manufactured by Ryoka Systems Inc., trade name: MM557N-M100 Type) at an objective lens: magnification 10, intermediate lens: magnification 1, camera: XC-ST30 1/3 type (manufactured by Sony Corporation), visual field: 468.0 µm×351.2 µm, measurement mode: Smooth Phase, central wavelength of optical filter: 520 nm. When distortion such as curling had been generated in the laminated film, measurement was performed at the condition under which distortion had been removed using a plate for easy adhesion etc. In addition, the arithmetic average high (Sa) was measured concerning a surface on a side opposite to the resin substrate of the laminated film. That is, in Comparative Examples 1 and 4, the arithmetic surface height is the arithmetic average height (Sa) of a surface of the gas barrier layer, and in Examples 1 to 5 and Comparative Examples 2 to 3, the arithmetic average height is the arithmetic average height (Sa) of a surface of the inorganic polymer layer.

<$NH_3$ Gas Generation Amount>

The $NH_3$ gas generation amount was measured using a device shown in FIG. 6. First, the same coating liquid (inorganic polymer layer coating liquid) containing an inorganic polymer as that of Examples and Comparative Examples was coated on the gas barrier layer of the resin substrate on which the gas barrier layer is formed, so that a thickness after drying on a hot plate at 90° C. for 1 minute became 500 nm, and curing treatment was performed by the same procedure as that of Examples and Comparative Examples to form an inorganic polymer layer. A sample after curing treatment was stored in a storage box through which dry nitrogen was flown, so that the inorganic polymer layer does not react with the water vapor in the atmospheric air. From a storage box under the dry nitrogen atmospheric, 0.5 g of the laminated film with this inorganic polymer layer was taken out, and rapidly accommodated in a glass chamber 91 (volume 940 mL), the cleaning level of which had been confirmed, and the high purity air at 25° C. which had been humidified to 85% RH was flown through the glass chamber 91 at a flow rate of 1500 mL/min. Two minutes after flowing initiation, the interior of the glass chamber 91 was heated using an oven 92 at a temperature raising rate of 10° C./min to raise a temperature from room temperature to 85° C., followed by heating at 85° C. for 1 hour. Temperature rise took 6 minutes. Gas components which were generated from the sample during heating for 1 hour were captured in a two-stage coupled impinger 93 containing pure water as an absorbing liquid. The absorbing liquid after gas components capturing was measured by ion chromatography (IC). The ammonium ion concentration (g/mL) in the absorbing liquid was multiplied by an absorbing liquid amount (mL) to obtain the mass (g) of an ammonium ion which had been captured in the absorbing liquid, and it was converted into ammonia, and divided by the mass (g) of the inorganic polymer layer to calculate the $NH_3$ gas generation amount per unit mass (mass ppm). In addition, conversion of a molecular weight was calculated with an ammonium ion molecular weight: 18 g/mol, and an ammonia molecular weight: 17 g/mol.

Comparative Example 1

(Preparation of Gas Barriering Laminated Film)

Using a manufacturing apparatus shown in FIG. 4, a gas barrier layer was formed on a resin substrate. That is, using a biaxially stretched polyethylene naphthalate film (abbreviation: PEN film, manufactured by Teijin DuPont Films Japan Limited, trade name: Teonex Q65HA, thickness 100 µm) as a resin substrate, the film was mounted on a delivery roll 11 in a vacuum chamber. The interior of the vacuum chamber was evacuated to $1 \times 10^{-3}$ Pa or less, and a film of the gas barrier layer was formed on the resin substrate while the resin substrate was conveyed at the constant rate of 0.5 m/min. In a plasma CVD device which was used for forming the gas barrier layer, plasma is generated between one pair of electrodes (film-forming rolls 31, 32), the resin substrate is conveyed while being tightly contacted with an electrode surface, and the gas barrier layer is formed on the resin substrate. Additionally, in the one pair of electrodes, a magnet (magnetic field generating devices 61, 62) is arranged in the electrode so that the magnetic flux density becomes high on a surface of the electrode and the resin substrate, and plasma is restrained on the electrode and the resin substrate at the high density, at plasma generation.

Upon formation of a film of the gas barrier layer, a hexamethyldisiloxane gas at 100 sccm (Standard Cubic Centimeter per Minute, 0° C., 1 atm standard), and an oxygen gas at 1000 sccm were introduced toward a space between electrodes becoming a film formation zone, alternate current electric power at 1.6 kW and the frequency of 70 kHz was supplied between electrode rolls, and electricity was discharged to generate plasma. Then, after an exhaust volume was regulated so that the pressure around an exhaust port in the vacuum chamber became 1 Pa, a gas barrier layer was formed on a conveyance resin substrate by a plasma CVD method. A thickness of the gas barrier layer of the resulting laminated film was 501.5 nm, the total light transmittance was 91%, the water vapor transmittance rate was $1.6 \times 10^{-4}$ g/m²/day, and the arithmetic average height (Sa) was 1.1 nm.

(Preparation of Organic EL Element)

An ITO film having a film thickness of 150 nm was pattern-formed on the gas barrier layer of the resulting laminated film by a sputtering method using a metal shadow mask. In addition, in such pattern film formation, the ITO film was pattern-formed so that two regions were formed on a surface of the laminated film as shown in FIG. 2 and FIG. 3, one region was utilized as an extracting electrode for a cathode (extracting electrode 203 (*a*) of a second electrode), and the other region was used as an anode (ITO elect rode) (first electrode 202). Then, a surface of the laminated film, on which the ITO film was formed, was subjected to cleaning and surface modifying treatment for 10 minutes using a UV ozone cleaning device (manufactured by Technovision, Inc., trade name: UV-312). Then, the filtrate obtained by filtering a suspension of poly(3,4-ethylenedioxythiophene)/polystyrenesulfonic acid (manufactured by Heraeus K.K., trade name: AI4083) with a filter having a diameter of 0.2 µm was spin-coated on a surface of the laminated film, on which the ITO film was formed, to form a film, and this was dried for 60 minutes under the temperature condition of 160° C. on a hot plate under the atmospheric pressure, to form a hole injection layer having a thickness of 65 nm on the ITO film.

Then, a xylene solution in which a luminescent material (polymer compound) is dissolved in xylene as an organic solvent was prepared. In addition, such a luminescent material (polymer compound) was prepared according to the same manner as that of the method of preparing a composition 1 described in Example 1 of JP-A-2012-144722. Then, the xylene solution was coated on a surface on which a hole injection layer was formed, of the laminated film on which the ITO film and the hole injection layer were formed, by a spin coating method under the atmospheric pressure, to form a coated film for a light emitting layer having a thickness of 80 nm. Thereafter, this was retained and dried for 10 minutes under the temperature condition of 130° C., at the nitrogen gas atmosphere under which the oxygen concentration and the moisture concentration were controlled at 10 volume ppm or less, respectively, to laminate a light emitting layer on the hole injection layer. Then, the hole injection layer and the light emitting layer which were film-formed on a part contacting with an external electrode (part of extracting electrodes for an anode and a cathode) were removed to expose a part so as to enable contacting with an external electrode. Thereafter, the laminated film on which the ITO film, the hole injection layer and the light emitting layer were formed was transferred to a deposition chamber, a position between a mask for a cathode was adjusted (aligned), and in order to form a film of a cathode so that a cathode was electrically connected to a part of an extracting electrode for a cathode while a cathode was laminated on a surface of the light emitting layer, a cathode was deposited while the mask and the substrate were rotated. The thus formed cathode was first deposited with sodium fluoride (NaF) by heating to a thickness of about 4 nm at a deposition rate of about 0.5 Å/sec, and deposited with aluminum (Al) to a thickness of about 100 nm at a deposition rate of about 4 Å/sec to obtain a laminated configuration.

Then, an electrolytic copper foil having a thickness of 35 m was laminated on a cathode, and this was cut using a roller cutter into a shape having such size that when seen from a cathode side, the whole light emitting layer can be covered, and a part of a contact part with an external electrode (part of an extracting electrode for an anode and a cathode) protrudes to the outside (see FIG. 3: shape having such size that when an electrolytic copper foil (sealing substrate 4) is seen from above as in FIG. 3, it has an area greater than that of a cathode, and a cathode becomes invisible, and a part of a contact part with the outside (part of extracting electrode for an anode and a cathode) (extracting electrode 203(*a*) for a first electrode 201 and a second electrode), which is formed on the laminated film 1, is seen so that it protrudes to the outside of the electrolytic copper foil), to prepare a sealing substrate. The thus prepared sealing substrate 4 composed of an electrolytic copper foil had a length of 40 mm, a width of 40 mm, and a thickness of 35 µm.

And, the sealing substrate (electrolytic copper foil) was heated for 15 minutes under the temperature condition of 130° C. in the nitrogen atmosphere to remove the moisture adsorbed on a surface (drying treatment was performed). Then, using a two-pack epoxy adhesive which is cured at room temperature (25° C.) by mixing a main agent composed of a bisphenol A-type epoxy resin and a curing agent composed of a modified polyamide as a sealing material, the sealing material was coated so as to cover a light emitting element portion composed of a laminated structure part composed of ITO film/hole injection layer/light emitting layer/cathode, and the sealing substrate was stuck on a layer of the sealing material so that the sealing substrate and the cathode faced each other, to perform sealing. That is, by coating the sealing material (adhesive) so as to cover the laminated structure part composed of ITO film/hole injection layer/light emitting layer/cathode (provided that a part of a connecting part (part of extracting electrode) for enabling each electrode and the outside to be electrically connected is excluded), so that bubbles did not enter in nitrogen, and sticking the sealing substrate on the layer of the sealing material on a surface of the laminated film after formation of a cathode, the light emitting element portion (laminated structure part of ITO film/hole injection layer/light emitting layer/cathode: except for a part of an extracting electrode) was sealed to manufacture an organic EL element. In addition, such an organic EL element was flexible. This organic EL element is of such a structure that a hole injection layer is further laminated on a light emitting element portion 2 of the organic EL element shown in FIG. 2 (organic EL element in which a configuration of a light emitting element portion is different from the light emitting element portion 2 shown in FIG. 2, in that it has further a hole injection layer, but has fundamentally the same configuration in other points). Herein, a thickness of the sealing material layer was 10 μm. In addition, the arithmetic average roughness Ra of one surface of the sealing substrate was 0.25 μm, and the arithmetic average roughness Ra of the other surface was 2.4 μm. In the present Comparative Example, a surface of the sealing substrate on a side contacting with the sealing material layer was a surface in which Ra of a surface is 0.25 μm.

A schematic view when such an organic EL element is seen from a sealing substrate side is shown in FIG. 3. Additionally, as shown in FIG. 3, when the organic EL element obtained in Comparative Example 1 is seen from a sealing substrate 4 side, the laminated film, a part of an anode (first electrode 201) which is extracted to the outside (part connecting to the outside: extracting electrode), the part connecting the cathode and the outside (extracting electrode 203(a) of a second electrode), and the sealing substrate 4 can be confirmed. Like this, in the present Comparative Example, upon sealing using the sealing material and the sealing substrate, surroundings of the light emitting element portion (laminated structure part composed of ITO film/hole injection layer/light emitting layer/cathode) were sealed while a part of the extracting electrode for each electrode is brought into the state where it can be connected to the outside. In addition, at the light emitting element portion, the size of a light emitting area (area of a part which emits light) was a length of 10 mm and a width of 10 mm.

When the resulting organic EL element was made to emit light, uniform full surface light emission of a length of 10 mm and a width of 10 mm was confirmed. Then, when an area ratio of a non-light emitting part (dark spots, hereinafter abbreviated as DS in some cases) which is seen when this organic EL element is stored under the acceleration test condition of 60° C. and 90% RH, and light is made to be emitted again after storage for 100 hours was obtained, it was found to be 19.8%.

Example 1

(Preparation of Gas Barriering Laminated Film)

Figure 8:
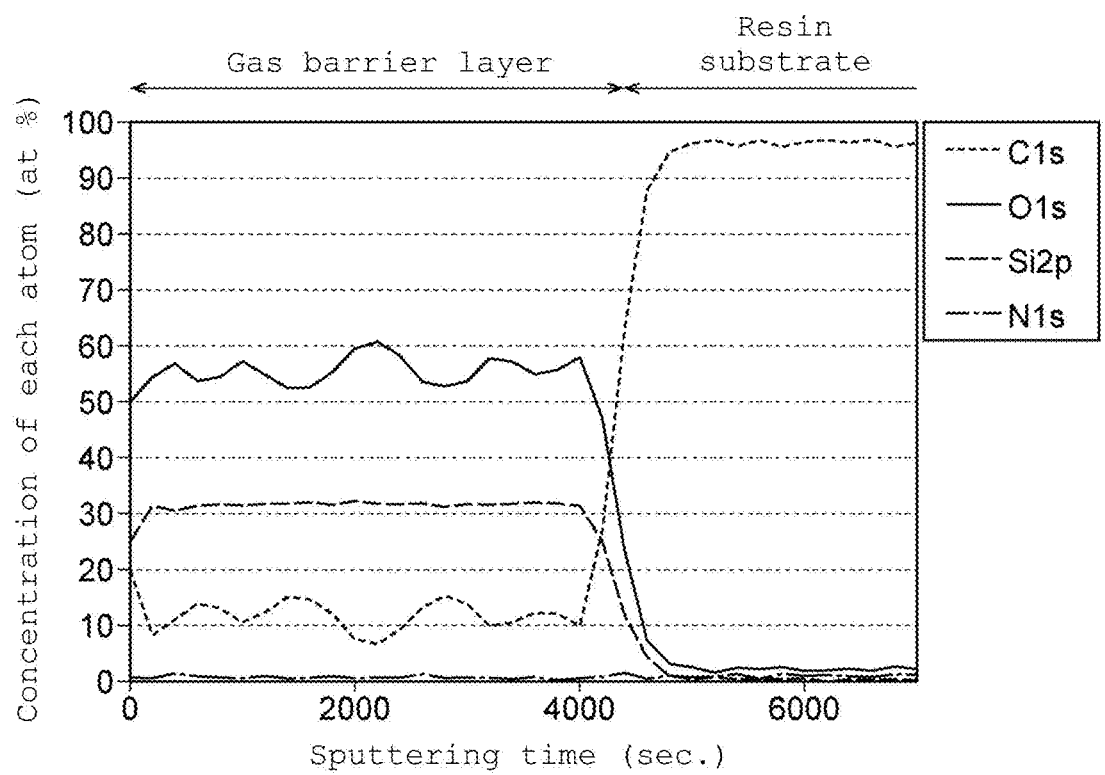
FIG. 8 is a graph showing the result of XPS depth profile measurement of a gas barrier layer in a gas barriering laminated film of Example 1.

According to the same manner as that of Comparative Example 1, a laminated film in which a gas barrier layer is laminated on a resin substrate was obtained. A graph made from distribution curves of a silicon atom, an oxygen atom, a carbon atom and a nitrogen atom of the gas barrier layer, obtained by XPS depth profile measurement, with a vertical axis as the concentration (at %) of each atom as the concentration of each element, and with a horizontal axis as a sputtering time is shown in FIG. 8. The etching rate as expressed by a $SiO_2$ thermally oxidized film reduction value was 0.09 nm/sec. As apparent from FIG. 8, the gas barrier layer prepared by the above-mentioned procedure satisfies the conditions (i) to (iii). Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500 nm, and a polysilazane layer was formed.

Then, using a vacuum ultraviolet irradiation device (manufactured by M.D. Excimer, Inc., trade name: MEIRA-M-1-152-H2), the formed polysilazane layer was curing-treated at the condition under which integrated illuminance of vacuum ultraviolet light to be irradiated to the polysilazane layer became 6000 $mJ/cm^2$, while replacement was performed so that the oxygen concentration in the irradiation device became 300 volume ppm or less under the condition of a $N_2$ gas flow rate of 20 L/min, and an inorganic polymer layer was formed. Thereby, a laminated film in which the gas barrier layer and the inorganic polymer layer are laminated on the resin substrate was obtained. The inorganic polymer layer shrank to a film thickness of 460 nm by irradiation of vacuum ultraviolet light, and the shrinkage rate was 8.0%. The total light transmittance of the resulting laminated film was 90%, the water vapor transmittance rate was $9.6 \times 10^{-7}$ $g/m^2/day$, the arithmetic average height (Sa) was 1.2 nm, and the generated gas amount of ammonia was 116 mass ppm.

(Preparation of Organic EL Element)

According to the same manner as that of Comparative Example 1 except that the laminated film prepared as described above was used, an organic EL element was prepared. When the resulting organic EL element was made to emit light, uniform full surface light emission of a length of 10 mm and a width of 10 mm was confirmed. Then, an area ratio of a non-light emitting part (dark spots) which is seen when this organic EL element is stored under the acceleration test condition of 60° C. and 90% RH, and the element is made to emit light again after storage for 100 hours was obtained, it was found to be 0.0%.

Example 2

(Preparation of Gas Barriering Laminated Film)

According to the same manner as that of Comparative Example 1, a laminated film in which a gas barrier layer is laminated on a resin substrate was obtained. Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500 nm, and a polysilazane layer was formed.

Then, using a vacuum ultraviolet irradiation device (manufactured by M.D. Excimer, Inc., trade name: MEIRA-M-1-152-H2), the formed polysilazane layer was curing-treated at the condition under which integrated illuminance of vacuum ultraviolet light to be irradiated to the polysilazane layer became 600 $mJ/cm^2$, while replacement was performed so that the oxygen concentration in the irradiation device became 300 volume ppm or less under the condition of a $N_2$ gas flow rate of 20 L/min, and an inorganic polymer layer was formed. Thereby, a laminated film in which the gas barrier layer and the inorganic polymer layer are laminated on the resin substrate was obtained. The inorganic polymer layer shrank to a film thickness of 495 nm by irradiation of vacuum ultraviolet light, and the shrinkage rate was 1.0%. The total light transmittance rate of the resulting laminated film was 90%, the water vapor transmittance rate was $3.9 \times 10^{-5}$ g/m$^2$/day, the arithmetic average height (Sa) was 1.2 nm, and the generated gas amount of ammonia was 3340 mass ppm.

(Preparation of Organic EL Element)

According to the same manner as that of Comparative Example 1 except that the laminated film prepared as described above was used, an organic EL element was prepared. When the resulting organic EL element was made to emit light, uniform full surface light emission of a length of 10 mm and a width of 10 mm was confirmed. Then, when an area ratio of a non-light emitting part (dark spots) which is seen when this organic EL element is stored under the acceleration test condition of 60° C. and 90% RH, and the element is made to emit light again after storage for 100 hours was obtained, it was found to be 1.0%.

Example 3

(Preparation of Gas Barriering Laminated Film)

According to the same manner as that of Comparative Example 1, a laminated film in which a gas barrier layer is laminated on a resin substrate was obtained. Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500 nm, and a polysilazane layer was formed.

Then, using a reactive ion etching device (manufactured by Samco Inc., trade name: RIE-200NL), the formed polysilazane layer was curing-treated using oxygen plasma which had been generated under the conditions of an RF electric power of 60 W, an oxygen flow rate of 30 sccm, a discharge total pressure of 5 Pa and 10 minutes, and an inorganic polymer layer was formed. Thereby, a laminated film in which the gas barrier layer and the inorganic polymer layer are laminated on a resin substrate was obtained. The inorganic polymer layer shrank to a film thickness of 490 nm by curing treatment, and the shrinkage rate was 2.0%. The total light transmittance of the resulting laminated film was 90%, the water vapor transmittance rate was $1.7 \times 10^{-5}$ g/m$^2$/day, the arithmetic average height (Sa) was 1.3 nm, and the generated gas amount of ammonia was 510 mass ppm.

(Preparation of Organic EL Element)

According to the same manner as that of Comparative Example 1 except that the laminated film prepared as described above was used, an organic EL element was prepared. When the resulting organic EL element was made to emit light, uniform full surface light emission of a length of 10 mm and a width of 10 mm was confirmed. Then, when an area ratio of a non-light emitting part (dark spots) which is seen when this organic EL element is stored under the acceleration test condition of 60° C. and 90% RH, and the element is made to emit light again after storage for 100 hours was obtained, it was found to be 0.8%.

Comparative Example 2

(Preparation of Gas Barriering Laminated Film)

According to the same manner as that of Comparative Example 1, a laminated film in which a gas barrier layer is laminated on a resin substrate was obtained. Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500 nm, and a polysilazane layer was formed.

Then, using a high temperature high humidity testing machine (manufactured by TOKYO RIKAKIKAI CO., LTD., trade name: KCL-2000W), the formed polysilazane layer was curing-treated under the conditions of 85° C., 85% RH and 180 minutes, an inorganic polymer layer was formed. Thereby, a laminated film in which the gas barrier and the inorganic polymer layer are laminated on a resin substrate was obtained. The inorganic polymer layer shrank to a film thickness of 495 nm by curing treatment, and the shrinkage rate was 1.0%. The total light transmittance of the resulting laminated film was 90%, the water vapor transmittance rate was $1.4 \times 10^{-4}$ g/m$^2$/day, the arithmetic average height (Sa) was 25.2 nm, and the generated gas amount of ammonia was 79.8 mass ppm.

(Preparation of Organic EL Element)

According to the same manner as that of Comparative Example 1 except that the laminated film prepared as described above was used, an organic EL element was prepared. When the resulting organic EL element was made to emit light, light emission could not be obtained even at application of electric power.

Comparative Example 3

(Preparation of Gas Barriering Laminated Film)

According to the same manner as that of Comparative Example 1, a laminated film in which a gas barrier layer is laminated on a resin substrate was obtained. Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying and curing on a hot plate at 90° C. for 1 minute became 500 nm, and an inorganic polymer layer was formed. Thereby, a laminated film in which the gas barrier layer and the inorganic polymer layer are laminated on the resin substrate was obtained. The total light transmittance of the resulting laminated film was 90%, the water vapor transmittance rate was $5.0 \times 10^{-4}$ g/m$^2$/day, the arithmetic average height (Sa) was 1.2 nm, and the generated gas amount of ammonia was 28000 mass ppm.

(Preparation of Organic EL Element)

According to the same manner as that of Comparative Example 1 except that the laminated film prepared as described above was used, an organic EL element was prepared. When the resulting organic EL element was made to emit light, light emission could not be obtained even at application of electric power.

Comparative Example 4

(Preparation of Gas Barriering Laminated Film)

Using a manufacturing apparatus shown in FIG. 5, a gas barrier layer was formed on a resin substrate. That is, using a biaxially stretched polyethylene naphthalate film (abbreviation: PEN film, manufactured by Teijin DuPont Films Japan Limited, trade name: Teonex Q65HA, thickness 100 μm) as a resin substrate, the film was mounted on a delivery roll 307 installed in a vacuum chamber 301, and it was set that the film can be continuously conveyed to a winding roll 310 via a film-forming zone 311 for the gas barrier layer. After the resin substrate was mounted, the interior of the vacuum chamber 301 was evacuated to $1\times10^{-3}$ Pa or less, and a film of the gas barrier layer was formed on the resin substrate while the resin substrate was conveyed at the constant rate of 0.1 m/min. Concerning conveyance of the resin substrate, the resin substrate was conveyed so that it was parallel with one of opposite two sides of a rectangular inductor window 312 mounted at a lower portion of the film-forming zone 311 for the gas barrier layer, and was in a direction vertical to remaining opposite two sides.

In the plasma CVD device used for forming the gas barrier layer, inductively coupled plasma was formed on an inductor window 312. A biaxially stretched polyethylene naphthalate film used in the resin substrate had an asymmetric structure in which one side had been subjected to treatment for easy adhesion, and a film of the gas barrier layer was formed on a surface which had not been subjected to treatment for easy treatment. Upon film formation, a monosilane gas at 100 sccm (Standard Cubic Centimeter per Minute, 0° C., 1 atm standard), an ammonia gas at 500 sccm, and an oxygen gas at 0.75 sccm were introduced into a film formation zone 311, electric power at 1.0 kW and the frequency of 13.56 kHz was supplied to an induction coil 303, and electricity was discharged to generate plasma. Then, after an exhaust volume was regulated so that the pressure in the vacuum chamber 301 became 1 Pa, a gas barrier layer was formed on a conveyance resin substrate by an inductively coupled plasma CVD method, and a laminated film was obtained. A thickness of the gas barrier layer in the resulting laminated film was 500.0 nm, the total light transmittance was 90%, the water vapor transmittance rate was $2.2\times10^{-4}$ g/m$^2$/day, and the arithmetic average height (Sa) was 1.2 nm.

(Preparation of Organic EL Element)

According to the same manner as that of Comparative Example 1 except that the laminated film prepared as described above was used, an organic EL element was prepared. When the resulting organic EL element was made to emit light, uniform full surface light emission of a length of 10 mm and a width of 10 mm was confirmed. Then, when an area ratio of a non-light emitting part (dark spots) which is seen when this organic EL element is stored under the acceleration test condition of 60° C. and 90% RH, and the element is made to emit light again after storage for 100 hours was obtained, it was found to be 19.2%.

Example 4

(Preparation of Gas Barriering Laminated Film)

Figure 9:
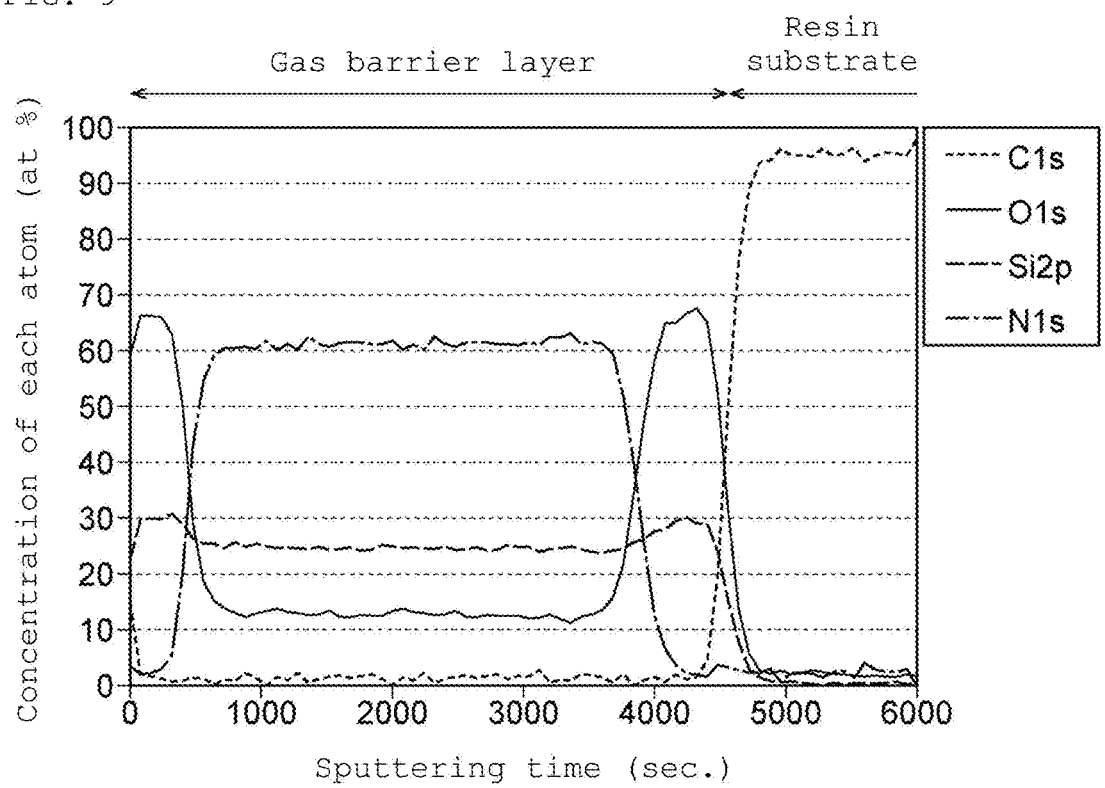
FIG. 9 is a graph showing the result of XPS depth profile measurement of a gas barrier layer in a gas barriering laminated film of Example 4.

According to the same manner as that of Comparative Example 4, a laminated film in which a gas barrier layer is laminated on a resin substrate was obtained. A graph made from distribution curves of a silicon atom, an oxygen atom, a carbon atom and a nitrogen atom, obtained by XPS depth profile measurement, with a vertical axis as the concentration (at %) of each atom as the concentration of each element, and with a horizontal axis as a sputtering a time is shown in FIG. 9. The etching rate was 0.09 nm/sec as expressed by a SiO$_2$ thermally oxidized film reduction value. As apparent from FIG. 9, the gas barrier layer prepared by the above-mentioned procedure satisfies the conditions (iv) and (v). Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500 nm, and a polysilazane layer was formed.

Then, using a vacuum ultraviolet irradiation device (manufactured by M.D. Excimer, Inc., trade name: MEIRA-M-1-152-H2, wavelength 172 nm), the formed polysilazane layer was curing-treated at the condition under which integrated illuminance of vacuum ultraviolet light to be irradiated to the polysilazane layer became 6000 mJ/cm$^2$, while replacement was performed so that the oxygen concentration in the irradiation device became 300 volume ppm or less under the condition of a N$_2$ gas flow rate of 20 L/min, and an inorganic polymer layer was formed. Thereby, a laminated film in which the gas barrier layer and the inorganic polymer layer are laminated on the resin substrate was obtained. The inorganic polymer layer shrank to a film thickness of 455 nm by irradiation of vacuum ultraviolet light, and the shrinkage rate was 9.0%. The total light transmittance of the resulting laminated film was 89%, the water vapor transmittance rate was $4.2\times10^{-6}$ g/m$^2$/day, the arithmetic average height (Sa) was 1.2 nm, and the generated gas amount of ammonia was 112 mass ppm.

(Preparation of Organic EL Element)

According to the same manner as that of Comparative Example 1 except that the laminated film prepared as described above was used, an organic EL element was prepared. When the resulting organic EL element was made to emit light, uniform full surface light emission of a length of 10 mm and a width of 10 mm was confirmed. Then, when an area ratio of a non-light emitting part (dark spots) which is seen when this organic EL element is stored under the acceleration test condition of 60° C. and 90% RH, and the element is made to emit light again after storage for 100 hours was obtained, it was found to be 0.0%.

Example 5

(Preparation of Gas Barriering Laminated Film)

According to the same manner as that of Example 1 except that curing treatment was performed by changing the condition to the condition under which integrated illuminance of vacuum ultraviolet light to be irradiated to the polysilazane layer became 2000 mJ/cm$^2$, a gas barriering laminated film and an organic EL element were prepared.

The inorganic polymer layer shrank to a film thickness of 460 nm by irradiation of vacuum ultraviolet light, and the shrinkage rate was 8.0%. The total light transmittance rate of the resulting laminated film was 92%, the water vapor transmittance rate was $1.3\times10^{-5}$ g/m$^2$/day, the arithmetic average height (Sa) was 1.2 nm, and the generated gas amount of ammonia was 200 mass ppm.

(Preparation of Organic EL Element)

According to the same manner as that of Comparative Example 1 except that the laminated film prepared as described above was used, an organic EL element was prepared. When the resulting organic EL element was made to emit light, uniform full surface light emission of a length of 10 mm and a width of 10 mm was confirmed. Then, when an area ratio of a non-light emitting part (dark spots) which is seen when this organic EL element is stored under the acceleration test condition of 60° C. and 90% RH, and the element is made to emit light again after storage for 100 hours was obtained, it was found to be 0.3%.

Results of assessment of the laminated films and the organic EL elements obtained in Examples 1 to 5 and Comparative Examples 1 to 4 are shown in the following Table 1. Additionally, the light emission state at an initial stage, and observation images of the light emission state after storage for 100 hours at 60° C. and 90% RH, of the organic EL elements obtained in Examples 1 to 5 as well as Comparative Examples 1 and 4 are shown in FIG. 7. A black point in the photograph of FIG. 7 is a light emission defective part called dark spot.

TABLE 1

| | | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| Inorganic polymer layer | Raw material | Perhydro polysilazane | Perhydro polysilazane | Perhydro polysilazane | Perhydro polysilazane | Perhydro polysilazane | — | Perhydro polysilazane | Perhydro polysilazane | — |
| | Film thickness (nm) | 460 | 495 | 490 | 460 | 460 | — | 495 | 500 | — |
| | Curing treatment condition | VUV (6 J/cm$^2$) | VUV (0.6 J/cm$^2$) | O$_2$ plasma (60 W, 10 min) | VUV (6 J/cm$^2$) | VUV (2 J/cm$^2$) | — | 85%, 85° C., 3 hrs | 90° C., 1 min | — |
| Sa (nm) | | 1.2 | 1.2 | 1.3 | 1.2 | 1.2 | 1.1 | 25.2 | 1.2 | 1.2 |
| NH$_3$ gas generation amount (mass ppm) | | 116 | 3340 | 510 | 112 | 200 | — | 79.8 | 28000 | — |
| WVTR (g/m$^2$/day) | | $9.6 \times 10^{-7}$ | $3.9 \times 10^{-5}$ | $1.7 \times 10^{-5}$ | $4.2 \times 10^{-6}$ | $1.3 \times 10^{-5}$ | $1.6 \times 10^{-4}$ | $1.4 \times 10^{-4}$ | $5.0 \times 10^{-4}$ | $2.2 \times 10^{-4}$ |
| DS area ratio (%) | | 0 | 1 | 0.8 | 0 | 0.3 | 19.8 | — | — | 19.2 |
| Total light transmittance (%) | | 90 | 90 | 90 | 89 | 92 | 91 | 90 | 90 | 90 |

What is claimed is:

1. A laminated film comprising at least a resin substrate, a gas barrier layer, and an inorganic polymer layer comprising a cured product of a composition comprising polysilazane laminated in this order, wherein
   an arithmetic average height (Sa) of a surface of the inorganic polymer layer is 20 nm or less,
   a NH$_3$ gas generation amount per unit mass of the inorganic polymer layer when the laminated film comprising the inorganic polymer layer is accommodated in a sample chamber and an interior of the sample chamber is heated at 85° C. for 1 hour while humidified air at 25° C. and 85% RH is flown through the sample chamber is 80 mass ppm or more and 5000 mass ppm or less, thereby
   a water vapor transmission rate of the laminated film in which the gas barrier layer is laminated on the resin substrate and the inorganic polymer layer is laminated on the gas barrier layer satisfies 0 or more to $1 \times 10^{-4}$ g/m$^2$/day or less.

2. The laminated film according to claim 1, wherein the NH$_3$ gas generation amount in the inorganic polymer layer is 80 mass ppm or more and 3000 mass ppm or less.

3. The laminated film according to claim 1, wherein the gas barrier layer is a silicon oxide-based layer which contains a silicon atom, an oxygen atom and a carbon atom, and satisfies all of the following conditions (i) to (iii), in a silicon distribution curve, an oxygen distribution curve and a carbon distribution curve, each showing a relationship between a distance from a surface of the gas barrier layer in a film thickness direction of the gas barrier layer, and a ratio of an amount of a silicon atom (an atomic ratio of silicon), a ratio of an amount of an oxygen atom (an atomic ratio of oxygen) or a ratio of an amount of a carbon atom (an atomic ratio of carbon), to the total amount of a silicon atom, the oxygen atom and a carbon atom:
   (i) the atomic ratio of silicon, the atomic ratio of oxygen and the atomic ratio of carbon satisfy the condition represented by the expression (1):

(atomic the ratio of oxygen)>(atomic the ratio of silicon)>(atomic the ratio of carbon)  (1)

in a region of 90% or more of a film thickness of the gas barrier layer;
   (ii) the carbon distribution curve has at least one extreme value; and
   (iii) an absolute value of a difference between a maximum value and a minimum value of the atomic ratio of carbon in the carbon distribution curve is 5 atom % or more.

4. The laminated film according to claim 1, wherein the gas barrier layer contains a silicon atom, an oxygen atom and a nitrogen atom, and
   the gas barrier layer is a silicon oxide-based layer satisfying all of the following conditions (iv) and (v):
   (iv) the gas barrier layer has a second film layer, a first film layer and a third film layer which have different oxygen content ratios, from a resin substrate side, and an average composition of a silicon atom, an oxygen atom and a nitrogen atom of the first film layer is in the range of 10 atom %≤Si≤40 atom %, 5 atom %≤O≤30 atom %, 50 atom %≤N≤80 atom %; and
   (v) an elemental ratio of a nitrogen atom and a silicon atom of the second and third film layers is in a range of the expression (2):

N/Si≤0.2  (2).

* * * * *